United States Patent
Malhan et al.

(10) Patent No.: US 8,373,209 B2
(45) Date of Patent: Feb. 12, 2013

(54) SEMICONDUCTOR DEVICE HAVING D MODE JFET AND E MODE JFET AND METHOD FOR MANUFACTURING THE SAME

(75) Inventors: Rajesh Kumar Malhan, Nagoya (JP); Naohiro Sugiyama, Nagoya (JP)

(73) Assignee: DENSO CORPORATION, Kariya (JP)

( * ) Notice: Subject to any disclaimer, the term of this patent is extended or adjusted under 35 U.S.C. 154(b) by 240 days.

(21) Appl. No.: 12/974,516

(22) Filed: Dec. 21, 2010

(65) Prior Publication Data
US 2011/0156053 A1     Jun. 30, 2011

(30) Foreign Application Priority Data
Dec. 25, 2009 (JP) ................................. 2009-294801

(51) Int. Cl.
*H01L 29/12* (2006.01)
(52) U.S. Cl. ................. 257/270; 257/E21.384; 438/147
(58) Field of Classification Search ................. 257/256, 257/265, 270, E21.051, E21.384; 438/147, 438/186
See application file for complete search history.

(56) References Cited

U.S. PATENT DOCUMENTS

| | | |
|---|---|---|
| 5,973,550 A | 10/1999 | Bowers et al. |
| 6,503,782 B2 | 1/2003 | Casady et al. |
| 2005/0110054 A1 | 5/2005 | Wohlmuth |
| 2006/0113593 A1 * | 6/2006 | Sankin et al. ................. 257/341 |
| 2007/0072376 A1 | 3/2007 | Chen et al. |
| 2009/0251197 A1 | 10/2009 | Friedrichs |

* cited by examiner

*Primary Examiner* — Thomas L Dickey
(74) *Attorney, Agent, or Firm* — Posz Law Group, PLC

(57) ABSTRACT

A semiconductor device includes: a substrate; and depletion and enhancement mode JFETs. The depletion mode JFET includes: a concavity on the substrate; a channel layer in the concavity; a first gate region on the channel layer; first source and drain regions on respective sides of the first gate region in the channel layer; first gate, source and drain electrodes. The enhancement mode JFET includes: a convexity on the substrate; the channel layer on the convexity; a second gate region on the channel layer; second source and drain regions on respective sides of the second gate region in the channel layer; second gate, source and drain electrodes. A thickness of the channel layer in the concavity is larger than a thickness of the channel layer on the convexity.

27 Claims, 20 Drawing Sheets

SEMICONDUCTOR DEVICE HAVING D MODE JFET AND E MODE JFET AND METHOD FOR MANUFACTURING THE SAME

CROSS REFERENCE TO RELATED APPLICATION

This application is based on Japanese Patent Application No. 2009-294801 filed on Dec. 25, 2009, the disclosure of which is incorporated herein by reference.

FIELD OF THE INVENTION

The present invention relates to a semiconductor device having a D mode JFET and a E mode JFET and a manufacturing method of a semiconductor device having a D mode JFET and a E mode JFET.

BACKGROUND OF THE INVENTION

Conventionally, a CMOS transistor including a N channel MOSFET and a P channel MOSFET is used for a switching device in an analog circuit or the like. A SiC semiconductor device also provides a CMOS transistor. However, in the SiC semiconductor device, an electron mobility and a hole mobility are largely different from each other. Thus, in the CMOS transistor, it is necessary to adjust an area of each of the P channel MOSFET and the N channel MOSFET so as to equalize channel mobility of the electron and the hole.

FIG. 20A shows a graph of temperature dependency of an electron mobility at various impurity concentrations of a channel layer in 6H—SiC, and FIG. 20B shows a graph of temperature dependency of an electron mobility at various impurity concentrations of a channel layer in 4H—SiC. Further, FIG. 21 shows a relationship between a hole mobility and an acceptor density in each of 6H—SiC and 4H—SiC. As shown in FIGS. 20A to 21, for example, although the electron mobility at 100K reaches three figures, the hole mobility is around two figures. Thus, the electron mobility is about ten times larger than the hole mobility. When the CMOS transistor having a N channel MOSFET and a P channel MOSFET is made of SiC, the area of the P channel MOSFET should be ten times larger than the area of the N channel MOSFET in order to equalize the electron mobility and the hole mobility. Accordingly, when the CMOS transistor is formed from a SiC substrate, it is necessary to increase the dimensions of the CMOS transistor.

In a HEMT made of semiconductor material such as GaN, a structure having a combination of an element operated in a depletion mode and an element operated in an enhanced mode is disclosed in US Patent Application Publication No. 2005/0110054. Here, the depletion mode is defined as D mode, and the enhanced mode is defined as E mode. The channel mobility of the D mode element is equal to the channel mobility of the E mode element since the device does not include the N channel MOSFET and the P channel MOSFET. However, it is difficult to form a certain analog circuit in a semiconductor device including a E mode element and a D mode element. In this case, it is not necessary to adjust the area of the D mode element and the E mode element to equalize the channel mobility. Specifically, the area of the D mode element is equal to the area of the E mode element.

However, in the SiC device, there is no disclosure to form the D mode element and the E mode element in the same substrate. Accordingly, it is required to form the SiC semiconductor device having the D mode element and the E mode element in the same substrate.

Here, although the semiconductor device has the D mode element and the E mode element in the same substrate, it is also required for other materials to form a semiconductor device having a D mode element and a E mode element in the same substrate.

SUMMARY OF THE INVENTION

In view of the above-described problem, it is an object of the present disclosure to provide a semiconductor device having a D mode JFET and a E mode JFET. It is another object of the present disclosure to provide a manufacturing method of a semiconductor device having a D mode JFET and a E mode JFET.

According to a first aspect of the present disclosure, a semiconductor device includes: a substrate having a first surface and made of semiconductor material; and a depletion mode JFET and an enhancement mode JFET, which are disposed in the substrate. The depletion mode JFET includes: a concavity disposed on the first surface of the substrate; a channel layer epitaxially grown on the substrate and having a first conductive type, wherein the channel layer is disposed in the concavity; a first gate region epitaxially grown on the channel layer and having a second conductive type; a first source region and a first drain region disposed on respective sides of the first gate region in the channel layer, wherein each of the first source region and the first drain region has the first conductive type and an impurity concentration higher than the channel layer; a first gate electrode electrically coupled with the first gate region; a first source electrode electrically coupled with the first source region; and a first drain electrode electrically coupled with the first drain region. The enhancement mode JFET includes: a convexity disposed on the first surface of the substrate; the channel layer disposed on the convexity; a second gate region epitaxially grown on the channel layer and having a second conductive type; a second source region and a second drain region disposed on respective sides of the second gate region in the channel layer, wherein each of the second source region and the second drain region has the first conductive type and an impurity concentration higher than the channel layer; a second gate electrode electrically coupled with the second gate region; a second source electrode electrically coupled with the second source region; and a second drain electrode electrically coupled with the second drain region. A thickness of the channel layer in the concavity is larger than a thickness of the channel layer on the convexity.

In the above device, since the thickness of the channel layer in the concavity is different from the thickness of the channel layer on the convexity, the channel layer in the concavity provides the depletion mode JFET, and the channel layer on the convexity provides the enhancement mode JFET. The depletion mode JFET and the enhancement mode JFET are formed in the same substrate.

According to a second aspect of the present disclosure, a semiconductor device includes: a substrate having a first surface and made of semiconductor material; and a depletion mode JFET and an enhancement mode JFET, which are disposed in the substrate. The depletion mode JFET includes: a first concavity disposed on the first surface of the substrate; a channel layer epitaxially grown on the substrate and having a first conductive type, wherein the channel layer is disposed in the first concavity; a first gate region epitaxially grown on the channel layer and having a second conductive type; a first source region and a first drain region disposed on respective sides of the first gate region in the channel layer, wherein each of the first source region and the first drain region has the first conductive type and an impurity concentration higher than the channel layer; a first gate electrode electrically coupled with the first gate region; a first source electrode electrically coupled with the first source region; and a first drain electrode electrically coupled with the first drain region. The enhancement mode JFET includes: a second concavity disposed on the first surface of the substrate; the channel layer disposed in the second concavity; a second gate region epitaxially grown on the channel layer and having a second conductive type; a second source region and a second drain region disposed on respective sides of the second gate region in the channel layer, wherein each of the second source region and the second drain region has the first conductive type and an impurity concentration higher than the channel layer; a second gate electrode electrically coupled with the second gate region; a second source electrode electrically coupled with the second source region; and a second drain electrode electrically coupled with the second drain region. A bottom of the first concavity has a first width along with a direction from the first source region to the first drain region of the depletion mode JFET. A bottom of the second concavity has a second width along with a direction from the second source region to the second drain region of the enhancement mode JFET. The second width is larger than the first width. A thickness of the channel layer in the second concavity is smaller than a thickness of the channel layer in the first concavity.

In the above device, since the thickness of the channel layer in the first concavity is different from the thickness of the channel layer in the second concavity, the channel layer in the first concavity provides the depletion mode JFET, and the channel layer in the second concavity provides the enhancement mode JFET. The depletion mode JFET and the enhancement mode JFET are formed in the same substrate.

According to a third aspect of the present disclosure, a semiconductor device includes: a substrate having a first surface and made of semiconductor material; and a depletion mode JFET and an enhancement mode JFET, which are disposed in the substrate. The depletion mode JFET includes: a first convexity disposed on the first surface of the substrate; a channel layer epitaxially grown on the substrate and having a first conductive type, wherein the channel layer is disposed on the first convexity; a first gate region epitaxially grown on the channel layer and having a second conductive type; a first source region and a first drain region disposed on respective sides of the first gate region in the channel layer, wherein each of the first source region and the first drain region has the first conductive type and an impurity concentration higher than the channel layer; a first gate electrode electrically coupled with the first gate region; a first source electrode electrically coupled with the first source region; and a first drain electrode electrically coupled with the first drain region. The enhancement mode JFET includes: a second convexity disposed on the first surface of the substrate; the channel layer disposed on the second convexity; a second gate region epitaxially grown on the channel layer and having a second conductive type; a second source region and a second drain region disposed on respective sides of the second gate region in the channel layer, wherein each of the second source region and the second drain region has the first conductive type and an impurity concentration higher than the channel layer; a second gate electrode electrically coupled with the second gate region; a second source electrode electrically coupled with the second source region; and a second drain electrode electrically coupled with the second drain region. A top of the first convexity has a first width along with a direction from the first source region to the first drain region of the depletion mode JFET. A top of the second convexity has a second width along with a direction from the second source region to the second drain region of the enhancement mode JFET. The second width is smaller than the first width. A thickness of the channel layer on the second convexity is smaller than a thickness of the channel layer on the first convexity.

In the above device, since the thickness of the channel layer on the first convexity is different from the thickness of the channel layer on the second convexity, the channel layer on the first convexity provides the depletion mode JFET, and the channel layer on the second convexity provides the enhancement mode JFET. The depletion mode JFET and the enhancement mode JFET are formed in the same substrate.

According to a fourth aspect of the present disclosure, a manufacturing method of a semiconductor device having a depletion mode JFET and an enhancement mode JFET includes: selectively etching a channel-region-to-be-formed region of a depletion mode JFET region on a first surface of a substrate made of semiconductor material so that a concavity is formed on the channel-region-to-be-formed region; selectively etching a region around a channel-region-to-be-formed region of an enhancement mode JFET region on the first surface of the substrate so that a convexity is formed on the channel-region-to-be-formed region; epitaxially growing a channel layer having the first conductive type on the substrate, in the concavity and on the convexity, wherein a thickness of the channel layer on the convexity is smaller than a thickness of the channel layer in the concavity; epitaxially growing a gate region having a second conductive type on the channel layer in both of the depletion mode JFET region and the enhancement mode JFET region; forming a source region and a drain region on respective sides of the gate region in the channel layer of both of the depletion mode JFET region and the enhancement mode JFET region, wherein each of the source region and the drain region has the first conductive type and an impurity concentration higher than the channel layer; forming a gate electrode electrically coupled with the gate region; forming a source electrode electrically coupled with the source region; and forming a drain electrode electrically coupled with the drain region.

In the above method, since the thickness of the channel layer in the concavity is different from the thickness of the channel layer on the convexity, the channel layer in the concavity provides the depletion mode JFET, and the channel layer on the convexity provides the enhancement mode JFET. The depletion mode JFET and the enhancement mode JFET are formed in the same substrate.

According to a fifth aspect of the present disclosure, a manufacturing method of a semiconductor device having a depletion mode JFET and an enhancement mode JFET includes: selectively etching a channel-region-to-be-formed region of a depletion mode JFET region on a first surface of a substrate made of semiconductor material so that a first concavity is formed on the channel-region-to-be-formed region; selectively etching a channel-region-to-be-formed region of an enhancement mode JFET region on the first surface of the substrate so that a second concavity is formed on the channel-region-to-be-formed region, epitaxially growing a channel layer having the first conductive type on the substrate, in the first concavity and in the second concavity, wherein a thickness of the channel layer in the second concavity is smaller than a thickness of the channel layer in the first concavity; epitaxially growing a gate region having a second conductive type on the channel layer in both of the depletion mode JFET region and the enhancement mode JFET region; forming a source region and a drain region on respective sides of the gate region in the channel layer of both of the depletion mode JFET region and the enhancement mode JFET region, wherein each of the source region and the drain region has the first conductive type and an impurity concentration higher than the channel layer; forming a gate electrode electrically coupled with the gate region; forming a source electrode electrically coupled with the source region; and forming a drain electrode electrically coupled with the drain region. A bottom of the first concavity has a first width along with a direction from the source region to the drain region of the depletion mode JFET. A bottom of the second concavity has a second width along with a direction from the source region to the drain region of the enhancement mode JFET. The second width is larger than the first width.

In the above method, since the thickness of the channel layer in the first concavity is different from the thickness of the channel layer in the second concavity, the channel layer in the first concavity provides the depletion mode JFET, and the channel layer in the second concavity provides the enhancement mode JFET. The depletion mode JFET and the enhancement mode JFET are formed in the same substrate.

According to a sixth aspect of the present disclosure, a manufacturing method of a semiconductor device having a depletion mode JFET and an enhancement mode JFET includes: selectively etching a region around a channel-region-to-be-formed region of a depletion mode JFET region on a first surface of a substrate made of semiconductor material so that a first convexity is formed on the channel-region-to-be-formed region; selectively etching a region around a channel-region-to-be-formed region of an enhancement mode JFET region on a first surface of the substrate so that a second convexity is formed on the channel-region-to-be-formed region; epitaxially growing a channel layer having the first conductive type on the substrate, on the first convexity and on the second convexity, wherein a thickness of the channel layer on the second convexity is smaller than a thickness of the channel layer on the first convexity; epitaxially growing a gate region having a second conductive type on the channel layer in both of the depletion mode JFET region and the enhancement mode JFET region; forming a source region and a drain region on respective sides of the gate region in the channel layer of both of the depletion mode JFET region and the enhancement mode JFET region, wherein each of the source region and the drain region has the first conductive type and an impurity concentration higher than the channel layer; forming a gate electrode electrically coupled with the gate region; forming a source electrode electrically coupled with the source region; and forming a drain electrode electrically coupled with the drain region. A top of the first convexity has a first width along with a direction from the source region to the drain region of the depletion mode JFET. A top of the second convexity has a second width along with a direction from the source region to the drain region of the enhancement mode JFET. The second width is smaller than the first width.

In the above method, since the thickness of the channel layer on the first convexity is different from the thickness of the channel layer on the second convexity, the channel layer on the first convexity provides the depletion mode JFET, and the channel layer on the second convexity provides the enhancement mode JFET. The depletion mode JFET and the enhancement mode JFET are formed in the same substrate.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1A:
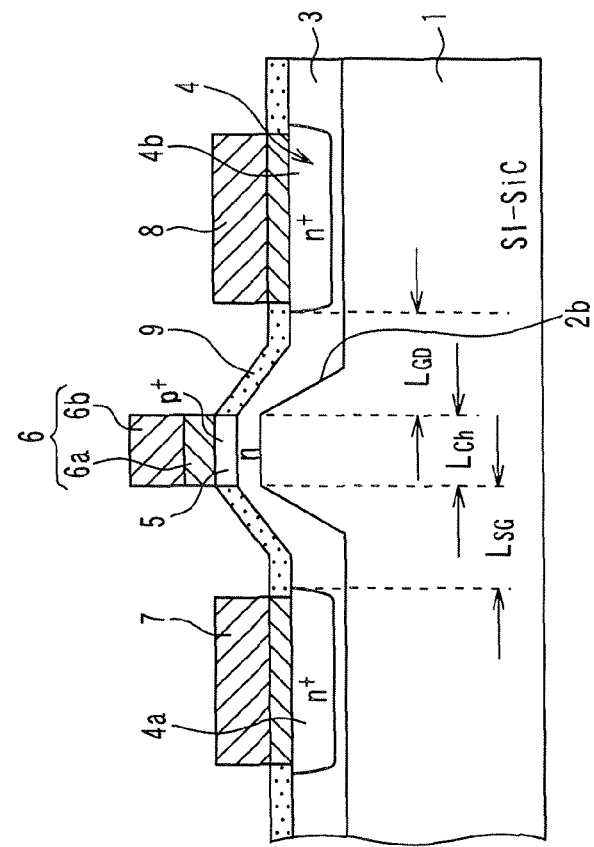
FIGS. 1A and 1B are diagrams showing a SiC semiconductor device having a D mode JFET and a E mode JFET according to a first embodiment.
Figure 1B:
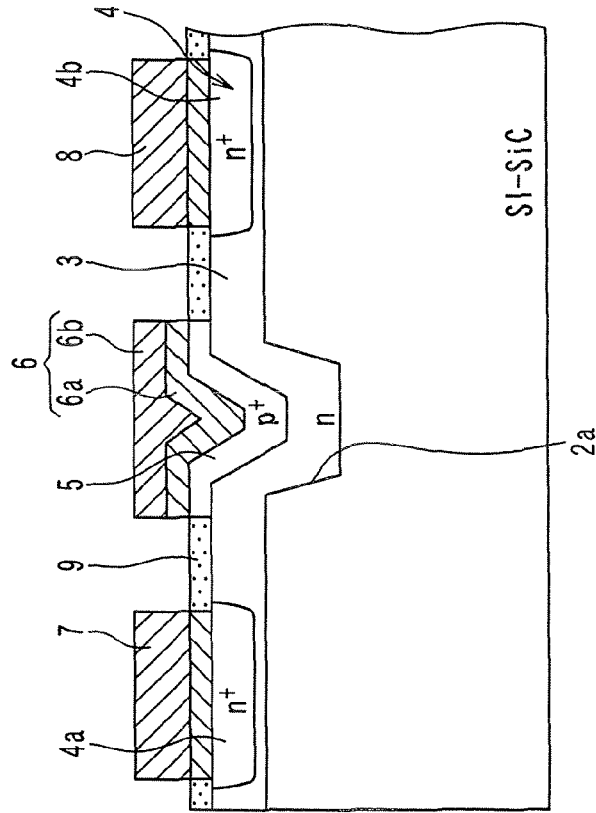

A first embodiment will be explained. FIGS. 1A and 1B shows a cross sectional view of a SiC semiconductor device having a D mode JFET and a E mode JFET according to the present embodiment. A structure of the SiC semiconductor device will be explained as follows.

The SiC semiconductor device includes the D mode JFET and the E mode JFET, which are formed in a SiC substrate 1. The SiC substrate 1 has semi-insulating property. Here, the semi-insulating property means that material is non-doped semiconductor material, and has resistance near insulating material. For example, in the present embodiment, the SiC substrate has a resistivity in a range between $1 \times 10^{10}$ Ω·cm and $1 \times 10^{11}$ Ω·cm. The thickness of the substrate 1 is in a range between 50 and 400 micrometers. Specifically, the thickness of the substrate 1 is 350 micrometers.

In a region for forming the D mode JFET, a concavity 2a is formed on a principal surface of the substrate 1 at a position for forming a channel region. In a region for forming the E mode JFET, a convexity 2b is formed on the principal surface of the substrate 1 at a position for forming a channel region. The concavity 2a is formed by selectively etching the principal surface of the substrate 1. The convexity 2b is formed by selectively etching a part of the surface of the substrate 1 around the convexity 2b.

The width of the concavity 2a and the width of the convexity 2b provide a channel length. The channel length of the D mode JFET is equalized to the channel length of the E mode JFET. For example, the width of the concavity 2a is in a range between 0.1 and 1.0 micrometers. Here, the width of the concavity 2a is defined as a width of a bottom of the concavity 2a. Specifically, the width of the concavity 2a is 0.5 micrometers. The width of the convexity 2b is in a range between 0.5 and 2.0 micrometers. Here, the width of the convexity 2b is defined as a width of the top of the convexity 2b. Specifically, the width of the convexity 2b is 0.5 micrometers. The concavity 2a and the convexity 2b extend in a direction perpendicular to the drawings of FIGS. 1A and 1B. A length of the concavity 2a in the direction perpendicular to the drawing of FIG. 1A defines the channel width, and a length of the convexity 2b in the direction perpendicular to the drawing of FIG. 1B defines the channel width. The length of the concavity 2a in the direction perpendicular to the drawing of FIG. 1A is equalized to the length of the convexity 2b in the direction perpendicular to the drawing of FIG. 1B so that the channel width of the D mode JFET is equal to the channel width of the E mode JFET.

The N conductive type channel layer 3 is formed on the surface of the substrate 1 including an inner surface of the concavity 2a and the convexity 2b. A channel is generated in the channel layer 3. For example, the N conductive type impurity concentration is in a range between $1 \times 10^{16}$ cm$^{-3}$ and $1 \times 10^{18}$ cm$^{-3}$. Specifically, the impurity concentration of the channel layer 3 is $1 \times 10^{17}$ cm$^{-3}$. The thickness of the channel layer 3 is basically in a range between 0.1 and 1.0 micrometers. Specifically, the thickness is 0.2 micrometers. The thickness of the channel layer 3 disposed in the concavity 2a is different from the thickness of the channel layer 3 disposed on the convexity 2b. Here, the concavity 2a is formed in a D mode JFET region, and the convexity 2b is formed in a E mode JFET region. Specifically, the thickness of the channel layer 3 in the concavity 2a is 0.75 micrometers, and the thickness of the channel layer 3 on the convexity 2b is 0.1 micrometers. Thus, the thickness of the channel layer 3 in the concavity 2a is thicker than the thickness of the channel layer 3 on the convexity 2b.

The N conductive type layer 4 is formed in a surface portion of the channel layer 3. The N conductive type layer 4 is disposed on both sides of the concavity 2a and on both sides of the convexity 2b so that the N conductive type layer 4 sandwiches the concavity 2a and the convexity 2b. The N conductive type layer 4 for sandwiching the concavity 2a and the convexity 2b in the D mode and the E mode JFETs disposed on a left side of the concavity 2a and the convexity 2b provides a N conductive type source region 4a. The N conductive type layer 4 for sandwiching the concavity 2a and the convexity 2b in the D mode and the E mode JFETs disposed on a right side of the concavity 2a and the convexity 2b provides a N conductive type drain region 4b. Each of the source region 4a and the drain region 4b has an N conductive type impurity concentration in a range between $5 \times 10^{18}$ cm$^{-3}$ and $1 \times 10^{20}$ cm$^{-3}$, and a thickness in a range between 0.1 and 1.0 micrometers. Specifically, the impurity concentration of each of the source region 4a and the drain region 4b is $2 \times 10^{19}$ cm$^{-3}$, and the thickness of each of the source region 4a and the drain region 4b is 0.4 micrometers.

A P conductive type gate region 5 is formed on the surface of the channel layer 3. The gate region 5 is separated from the source region 4a and the drain region 4b. A P conductive type impurity concentration of the gate region 5 is in a range between $5 \times 10^{18}$ cm$^{-3}$ and $5 \times 10^{19}$ cm$^{-3}$. A thickness of the gate region 5 is in a range between 0.1 and 1.0 micrometers. Specifically, the impurity concentration of the gate region 5 is $1 \times 10^{19}$ cm$^{-3}$, and the thickness of the gate region 5 is 0.4 micrometers.

A gate electrode 6 is formed on the surface of the gate region 5. A sidewall of the gate electrode 6 and the sidewall of the gate region 5 are disposed on the same plane. The gate electrode 6 has a stacking structure of multiple metal layers. For example, the gate electrode 6 includes a Ni series metal layer 6a, a Ti series metal layer 6b and an aluminum wiring layer or a gold layer (not shown), which are stacked in this order. The Ni series metal layer 6a is made of, for example, NiSi$_2$, which contacts the P conductive type gate region 5 with ohmic contact. The gold layer has good junction property with a wiring for electrically connecting to an external device. The thickness of the Ni series metal layer 6a is in a range between 0.1 and 0.5 micrometers. Specifically, the thickness of the Ni series metal layer 6a is 0.2 micrometers. The thickness of the Ti series metal layer 6b is in a range between 0.1 and 0.5 micrometers. Specifically, the thickness of the Ti series metal layer 6b is 0.1 micrometers. The thickness of the aluminum layer or the gold layer is in a range between 1.0 and 5.0 micrometers. Specifically, the thickness of the aluminum layer or the gold layer is 3.0 micrometer.

A source electrode 7 is formed on the source region 4a, and a drain electrode 8 is formed on the drain region 4b. The source electrode 7 and the drain electrode 8 are also made of the same material as the gate electrode 6. The gate electrode 6, the source electrode 7 and the drain electrode 8 are electrically isolated from each other with an interlayer insulation film 9.

Thus, the JFETs are formed. Further, the device further includes another interlayer insulation film, a protection film (not shown) and the like, which are made of a silicon oxide film, a silicon nitride film. Thus, the SiC semiconductor device is completed.

The D mode JFET in the device functions as a normally-on device, and the E mode JFET functions as a normally-off device.

Specifically, the D mode JFET performs D mode operation. Even when the gate voltage is not applied to the gate electrode, the depletion layer extending from the gate region 5 toward the channel layer 3 and/or the depletion layer extending from the substrate 1 toward the channel layer 3 does not completely pinch off the channel layer 3, so that the channel is partially formed in the channel layer 3. Accordingly, when the gate voltage is not applied to the gate electrode 6, the current flows between the source electrode 7 and the drain electrode 8 via the channel in the channel layer 3. When the negative gate voltage is applied to the gate electrode 6, the depletion layer largely extends. Thus, the channel in the channel layer 3 is disappeared, and therefore, the current does not flow between the source electrode 7 and the drain electrode 8. Thus, the D mode JFET functions as a normally-on device.

On the other hand, the E mode JFET performs the E mode operation. When the gate voltage is not applied to the gate electrode 6, the depletion layer extending from the gate region 5 toward the channel layer 3 and/or the depletion layer extending from the substrate 1 toward the channel layer 3 completely pinch off the channel layer 3. When the positive gate voltage is applied to the gate electrode 6, the depletion layer extending from the gate region 5 shrinks. Thus, the channel is formed in the channel layer 3, so that the current flows between the source electrode 7 and the drain electrode 8 via the channel in the channel layer 3. Thus, the E mode JFET functions as a normally-off device.

Next, a manufacturing method of the SiC semiconductor device having the D mode JFET and the E mode JFET will be explained.

First, the SiC substrate 1 having semi-insulating property is prepared. A mask (not shown) is arranged on the principal surface of the substrate 1. The mask has an opening in the D mode JFET region on a concavity-to-be-formed region and another opening in the E mode JFET region on a region other than a convexity-to-be-formed region. The substrate 1 is selectively etched with using the mask, so that the concavity 2a and the convexity 2b are formed on the principal surface of the substrate 1.

Next, the channel layer 3 is epitaxially grown on the surface of the substrate 1 including on the bottom of the concavity 2a and on the to of the convexity. The N conductive type impurity concentration of the channel layer 3 is in a range between $1\times10^{16}$ cm$^{-3}$ and $1\times10^{18}$ cm$^{-3}$. Specifically, the impurity concentration of the channel layer 3 is $1\times10^{17}$ cm$^{-3}$. The thickness of the channel layer 3 is basically in a range between 0.1 and 1.0 micrometers. Specifically, the thickness of the channel layer 3 is 0.2 micrometers. The thickness of the channel layer 3 in the concavity 2a of the D mode JFET region is different from the thickness of the channel layer 3 on the convexity 1b of the E mode JFET region because of a migration effect in a deposition process. For example, the thickness of the channel layer 3 in the concavity 2a is 0.75 micrometers. The thickness of the channel layer 3 on the convexity 2b is 0.1 micrometers.

Then, a mask made of LTO or the like is formed on the surface of the channel layer 3. The mask has an opening on a source-region-to-be-formed region and an opening on a drain-region-to-be-formed region. The N conductive type impurity is implanted on the channel layer 3 via the mask by an ion implantation method, and then, the thermal treatment is performed so that the implanted ion is activated. Thus, the N conductive type impurity concentration of each of the source region 4a and the drain region 4b is in a range between $5\times10^{18}$ cm$^{-3}$ and $1\times10^{20}$ cm$^{-3}$. Specifically, the impurity concentration of each of the source region 4a and the drain region 4b is $2\times10^{19}$ cm$^{-3}$. The thickness of each of the source region 4a and the drain region 4b is in a range between 0.1 and 1.0 micrometers. Specifically, the thickness of each of the source region 4a and the drain region 4b is 0.4 micrometers. Here, the forming step of the source region 4a and the drain region 4b may be performed after the P conductive type layer for providing the gate region 5 is formed and before the gate electrode 6 is formed.

The P conductive type layer is epitaxially grown on the surface of the channel layer 3, the surface of the source region 4a and the surface of the drain region 4b. The P conductive type impurity concentration of the P conductive type layer is in a range between $5\times10^{18}$ cm$^{-3}$ and $5\times10^{19}$ cm$^{-3}$. Specifically, impurity concentration of the P conductive type layer is $1\times10^{19}$ cm$^{-3}$. The thickness of the P conductive type layer is in a range between 0.1 and 0.5 micrometers. Specifically, the thickness of the P conductive type layer is 0.4 micrometers. A metal mask or a mask made of a silicon oxide film (not shown) is arranged on the surface of the gate region 5 to cover a region other than a gate-electrode-to-be-formed region. Then, the Ni series metal layer 6a and the Ti series metal layer 6b in the gate electrode 6 are deposited o the gate region 5. Then, the mask is removed, so that the Ni series metal layer 6a and the Ti series metal layer 6b are left only on the gate-electrode-to-be-formed region in a lift-off process. Thus, the gate electrode 6 is formed. When the P conductive type layer is patterned, the gate electrode 6 functions as a mask, so that the P conductive type gate region 5 is formed.

Then, the source electrode 7 and the drain electrode 8 are formed. Specifically, the Ni series metal layer and the Ti series metal layer are formed, and then, the anneal process is performed so that the Ni series metal layer and the Ti series metal layer contacts the source region 4a and the drain region 4b with ohmic contact. If necessary, a selective etching process is performed so that an element separation groove for isolating elements fro each other is formed. Then, the interlayer insulation film 9 is formed, and a contact hole is formed in the interlayer insulation film 9. After an aluminum layer is deposited, and then, patterned. Alternatively, a gold film is formed by a metal plating method. Thus, a metal layer such as the aluminum layer or the gold film is formed on an utmost outer surface of the gate electrode 6, the source electrode 7 and the drain electrode 8. After that, the protection film is formed. Thus, the SiC semiconductor device having the D mode JFET and the E mode JFET is manufactured.

In the SiC semiconductor device according to the present embodiment, the D mode JFET and the E mode JFET are formed in the same substrate 1. The channel layer 3 is epitaxially grown in the concavity 2a and on the convexity 2b. The thickness of the channel layer 3 in the D mode JFET is different from the thickness of the channel layer 3 in the E mode JFET.

Thus, the concavity 2a is formed in the D mode JFET region, and the convexity 2b is formed in the E mode JFET region, so that the channel layer 3 having different thickness in the same substrate 1 is prepared. Since the D mode JFET having the channel layer 3 and the E mode JFET having the channel layer 3, which has different thickness from the D mode JFET, are formed in the same substrate 1, the SiC semiconductor device having a combination of the D mode JFET and the E mode JFET is obtained.

In the SiC semiconductor device having the D mode JFET and the E mode JFET, the channel mobility of the channel in the D mode JFET is equal to the channel mobility of the channel in the E mode JFET. Accordingly, it is not necessary to adjust the area of each of the E mode JFET and the D mode JFET. When the channel length and the channel width of the D mode JFET are equal to the channel length and the channel width of the E mode JFET, the area of the D mode JFET is equal to the area of the E mode JFET.

Since the SiC substrate 1 is made of semi-insulating material, an electric wave generated in the operation of the JFET is absorbed. Thus, the SiC semiconductor device is suitably used for high frequency.

In the manufacturing method of the SiC semiconductor device, the channel layer 3 is epitaxially grown in the concavity 2a and on the convexity 2b, so that the thickness of the channel layer 3 in the D mode JFET is different from the thickness of the channel layer 3 in the E mode JFET. Accordingly, although it is necessary to perform the etching process for forming the concavity 2a and the convexity 2b, the manufacturing method of the SiC semiconductor device having the D mode JFET and the E mode JFET is easily performed.

It is experimented whether the characteristics of the D mode JFET and the E mode JFET in the SiC semiconductor device are appropriate. The results will be shown in FIGS. 2 to 6. Here, a channel length is defined as $L_{ch}$, which is 0.5 micrometers. A length between the source and the gate is defined as $L_{SG}$, which is 0.5 micrometers. A length between the gate and the drain is defined as $L_{GD}$, which is 0.5 micrometers.

Figure 2:
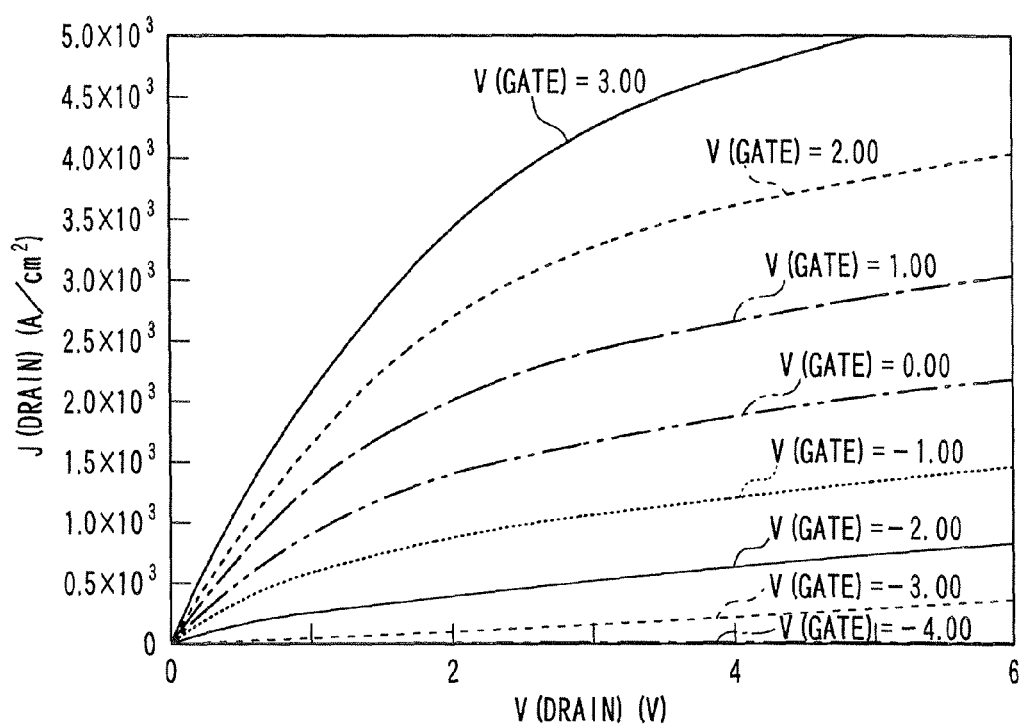
FIG. 2 is a graph showing a relationship between a drain voltage and a current density of a drain current in a D mode JFET at various gate voltages.
Figure 3:
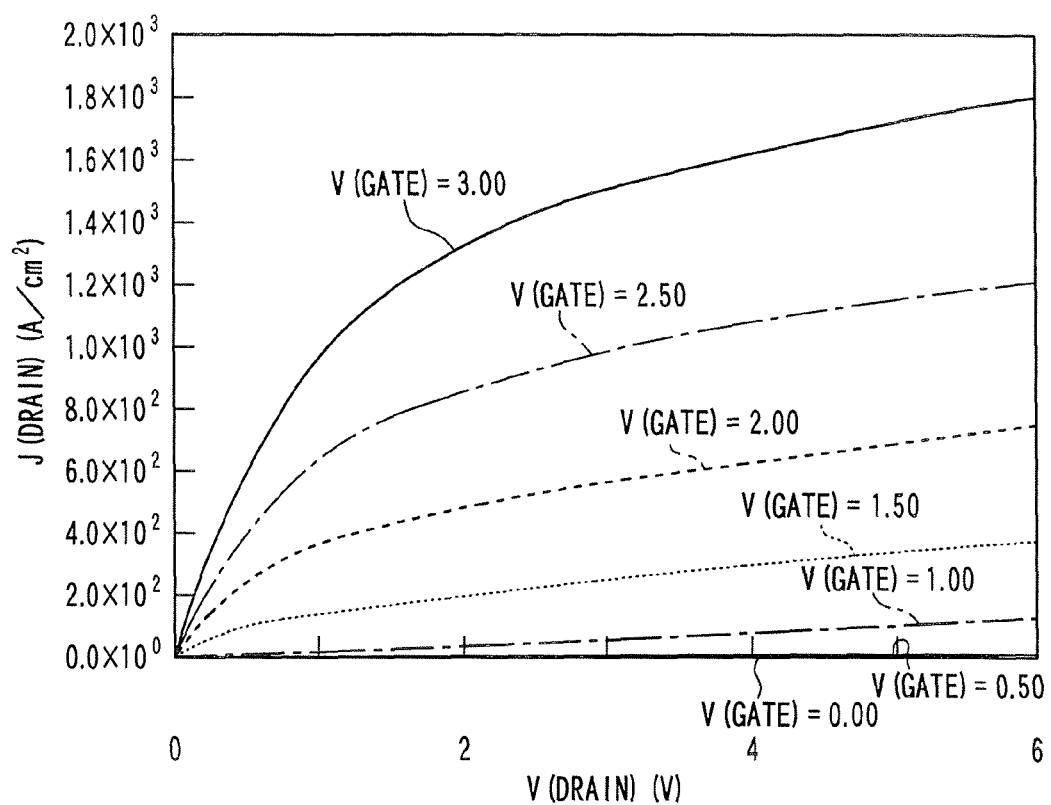
FIG. 3 is a graph showing a relationship between a drain voltage and a current density of a drain current in a E mode JFET at various gate voltages.

FIGS. 2 and 3 shows a relationship between a drain voltage V(DRAIN) and the current density J(DRAIN) of the drain current at various gate voltages V(GATE) in the D mode JFET and the E mode JFET, respectively.

As shown in FIG. 2, regarding the D mode JFET, when the drain voltage V(DRAIN) becomes large, the current density J(DRAIN) of the drain current is made large. When the gate voltage V(GATE) is equal to a potential (i.e., =−4V), which provides turn-off of the D mode JFET, the current density J(DRAIN) is substantially zero. When the gate voltage V(GATE) becomes large, the current density J(DRAIN) is made large. These characteristics show the D mode property. Further, as shown in FIG. 3, regarding the E mode JFET, when the drain voltage V(DRAIN) becomes large, the current density J(DRAIN) is made large. When the gate voltage V(GATE) is equal to a potential (i.e., =0V), which provides turn-off of the E mode JFET, the current density J(DRAIN) is substantially zero. When the gate voltage V(GATE) becomes large, the current density J(DRAIN) is made large. These characteristics show the E mode property. Thus, the D mode JFET clearly provides the D mode property, and the E mode JFET clearly provides the E mode property.

Figure 4:
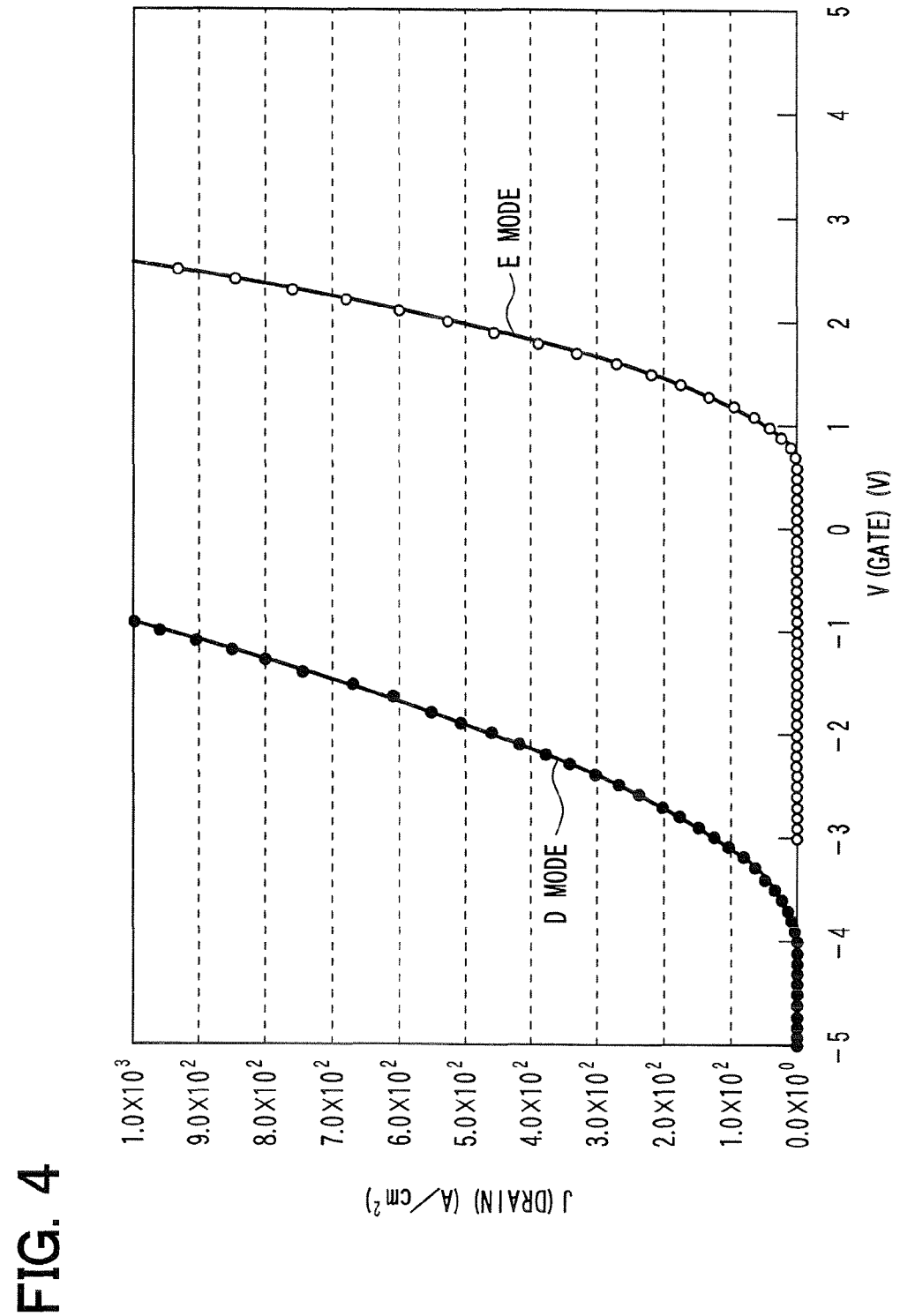
FIG. 4 is a graph showing a gate voltage and a current density of a drain current in each of the E mode and D mode JFETs.

FIG. 4 shows a relationship between the gate voltage V(GATE) and the current density J(DRAIN) of the drain current in each of the D mode JFET and the E mode JFET. As shown in FIG. 4, regarding the D mode JFET, when the negative gate voltage V(GATE) exceeds the potential of −4V, which provides a target voltage at which the D mode JFET turns off, the current density J(DRAIN) increases in an exponential manner. Regarding the E mode JFET, when the gate voltage V(GATE) exceeds a predetermined positive threshold voltage, the current density J(DRAIN) increases in an exponential manner. Thus, the D mode JFET and the E mode JFET have appropriate characteristics of the current density J(DRAIN) of the drain current with respect to the gate voltage V(GATE), respectively.

Figure 5A:
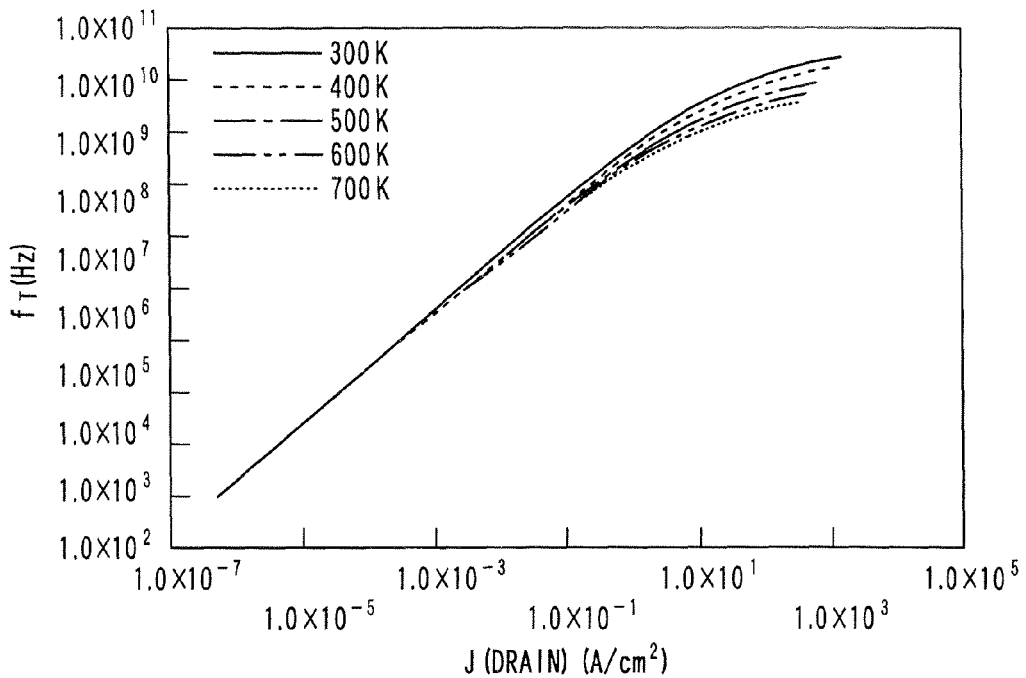
FIG. 5A is a graph showing a relationship between the current density of the drain current and a cut-off frequency at various temperatures in the D mode JFET.
Figure 5B:
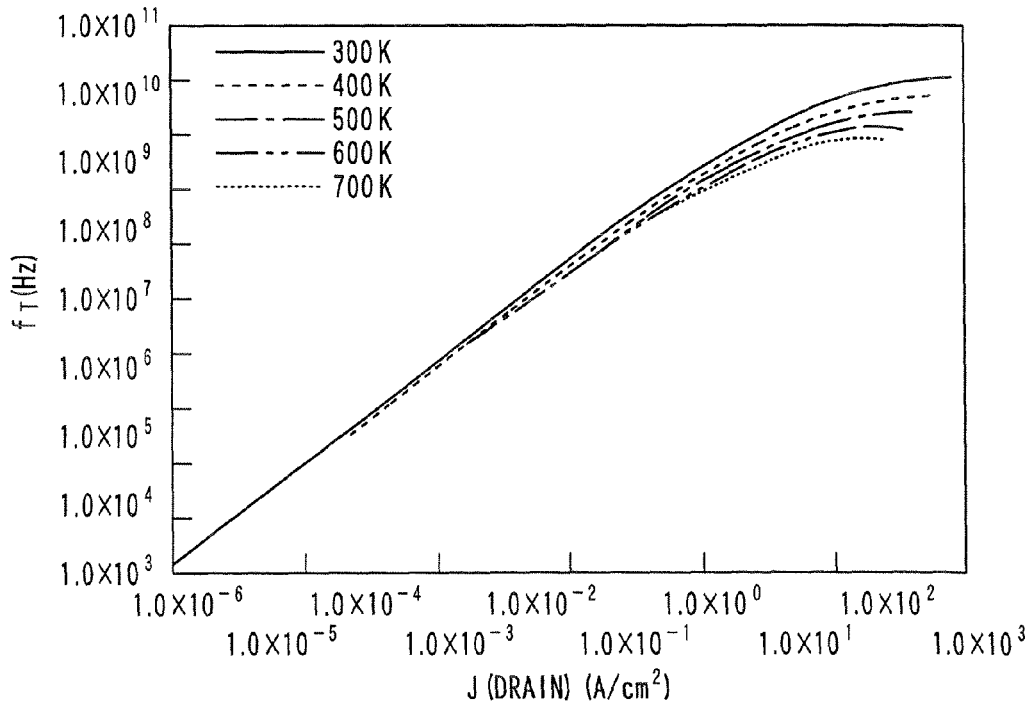
FIG. 5B is a graph showing a relationship between the current density of the drain current and a cut-off frequency at various temperatures in the E mode JFET.
Figure 6:
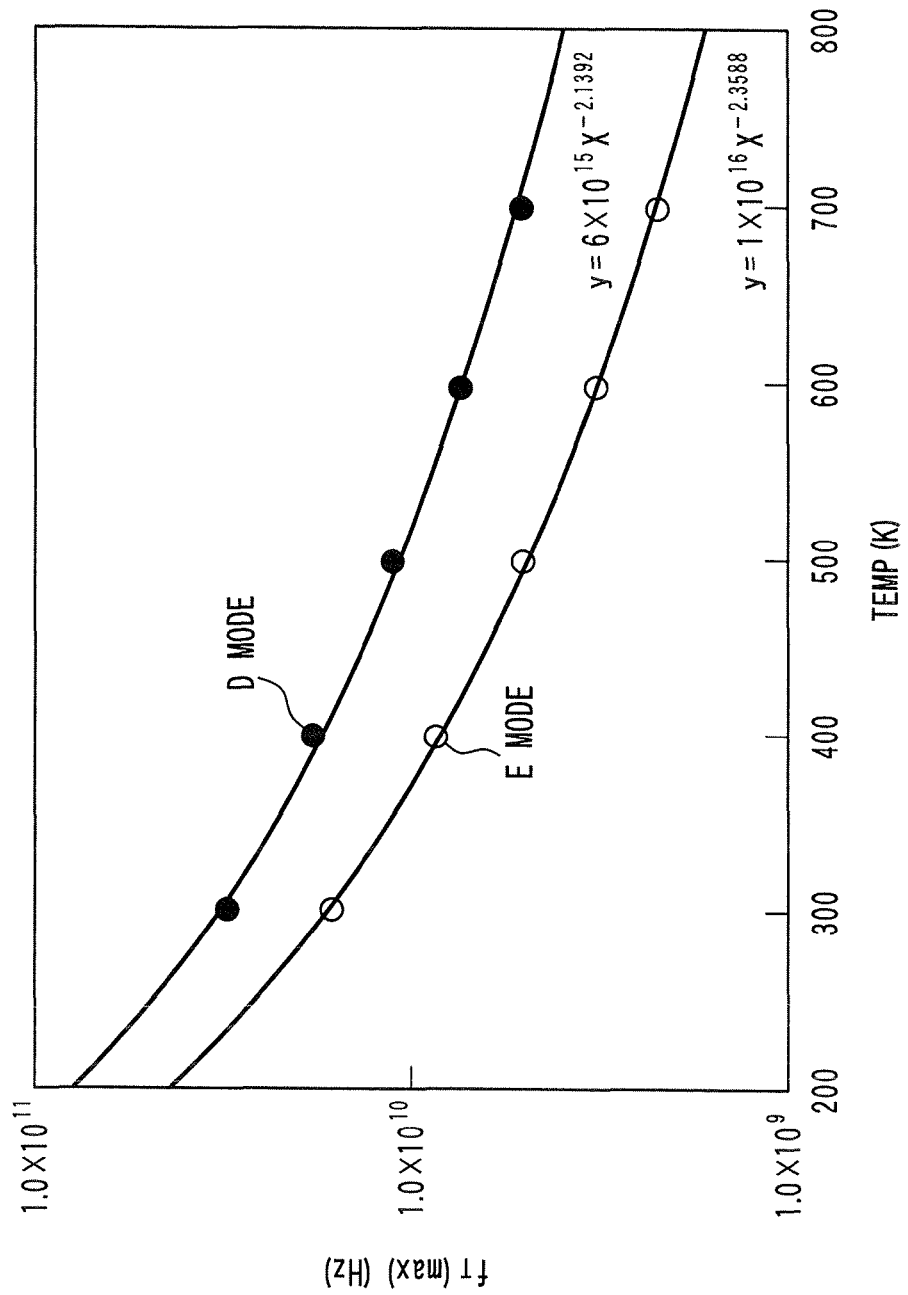
FIG. 6 is a graph showing a relationship between temperature and a maximum value of the cut-off frequency in each of the E mode and D mode JFETs.

FIGS. 5A and 5B show a relationship between the current density J(DRAIN) of the drain current and the cut-off frequency $f_T$ at various temperature in each of the D mode JFET and the E mode JFET. FIG. 6 shows a relationship between temperature and the maximum value $f_T(max)$ of the cut-off frequency $f_T$ in the SIC semiconductor device.

As shown in FIGS. 5A to 6, when the temperature is in a range between 300K and 700K, the change of the cut-off frequency $f_T$ with respect to the current density J(DRAIN) of the drain current is measured. In all cases, the high cut-off frequency $f_T$ is obtained. Specifically, as shown in FIG. 6, the current density J(DRAIN) is defined as X, and the maximum value fT(max) of the cut-off frequency fT is defined as Y. The cut-off frequency curve of the D mode JFET is shown by an equation of $Y=6\times10^{15}X^{-2.1392}$. The cut-off frequency curve of the E mode JFET is shown by an equation of $Y=1\times10^{16}X^{-2.3588}$. Accordingly, the cut-off frequency $f_T$ is larger than 10 GHz at 300K, which is substantially the room temperature. Further, the cut-off frequency $f_T$ is larger than 1 GHz at 700K, and therefore, the cut-off frequency $f_T$ is sufficiently high. Accordingly, in the SiC semiconductor device having the E mode JFET and the D mode JFET, in both of the D mode operation and the E mode operation, the cut-off frequency $f_T$ is sufficiently high. Thus, the device is suitably used for high frequency.

Second Embodiment

A second embodiment will be explained. A SiC semiconductor device according to the present embodiment includes a P conductive type buffer layer 10, compared with the device according to the first embodiment.

Figure 7A:
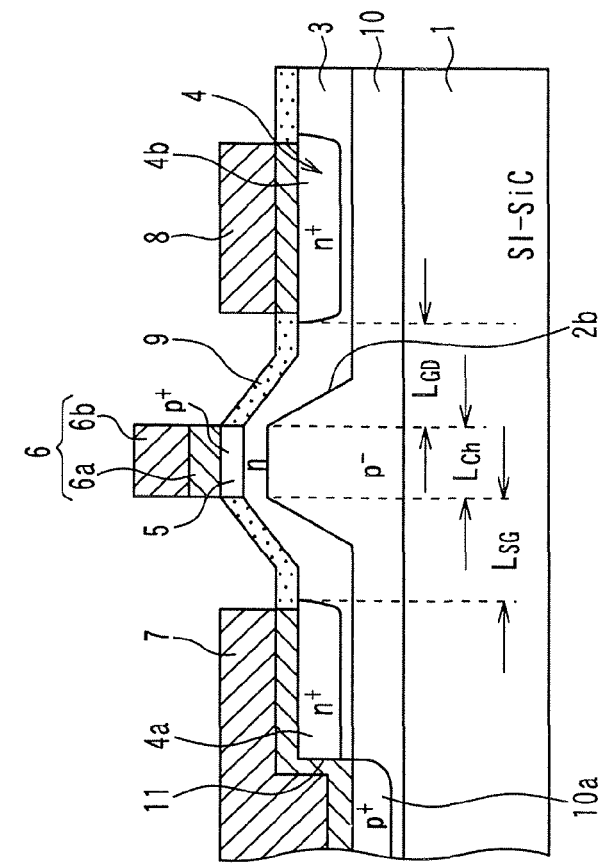
FIGS. 7A and 7B are diagrams showing a cross sectional view of a SiC semiconductor device having a D mode JFET and a E mode JFET according to a second embodiment.
Figure 7B:
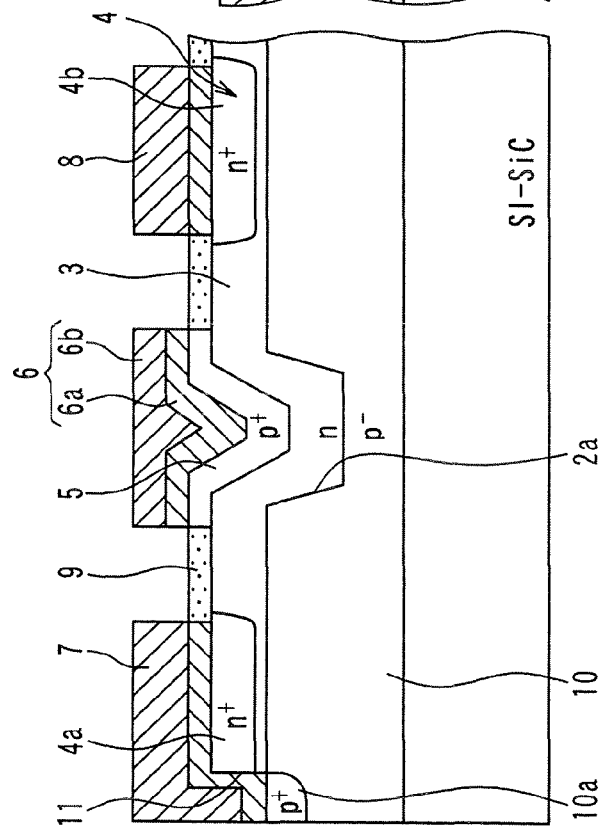

FIGS. 7A and 7B show the SiC semiconductor device having the D mode JFET and the E mode JFET. As shown in FIGS. 7A and 7B, the buffer layer 10 is formed on the surface of the substrate 1. An impurity concentration of the buffer layer 10 is lower than the gate region 5. The channel layer 3 is formed on the surface of the buffer layer 10. The buffer layer 10 provides a high breakdown voltage. The P conductive type impurity concentration of the buffer layer 10 is in a range between $1\times10^{16}$ cm$^{-3}$ and $1\times10^{17}$ cm$^{-3}$. Specifically, the impurity concentration of the buffer layer 10 is $1\times10^{16}$ cm$^{-3}$. The thickness of the buffer layer 10 is in a range between 0.2 and 2.0 micrometers. Specifically, the thickness of the buffer layer 10 is 0.4 micrometers. A P conductive type contact region 10a is formed in the buffer layer 10. The contact region 10a has a high impurity concentration. A concavity 11 is formed under the source electrode 7 such that the concavity 11 penetrates the source region 4a, and the contact region 10a is exposed on the bottom of the concavity 11. The source electrode 7 is embedded in the concavity 11, so that the buffer layer 10 is coupled with the source electrode 7 via the contact region 10a. Thus, the buffer layer 10 is fixed to the ground potential.

In the above structure, the effects similar to the first embodiment are obtained. Since the device includes the buffer layer 10, compared with the first embodiment, the breakdown voltage of the device is higher than that in the first embodiment. Further, since the device includes the buffer layer 10, the electric wave generated in the operation of the JFET is absorbed in the buffer layer 10. Thus, the SiC semiconductor device is suitably used for high frequency.

The manufacturing method of the SiC semiconductor device according to the present embodiment is basically similar to that in the first embodiment. Since the device includes the buffer layer 10, the manufacturing method of the present embodiment further includes a step for forming the buffer layer 10 on the surface of the substrate 1 and a step for forming the concavity 2a and the convexity 2b in the E mode JFET and the D mode JFET in the buffer layer 10.

Third Embodiment

A third embodiment will be explained. A SiC semiconductor device according to the present embodiment has a structure of the D mode JFET and the E mode JFET, which is different from that of the first embodiment.

Figure 8A:
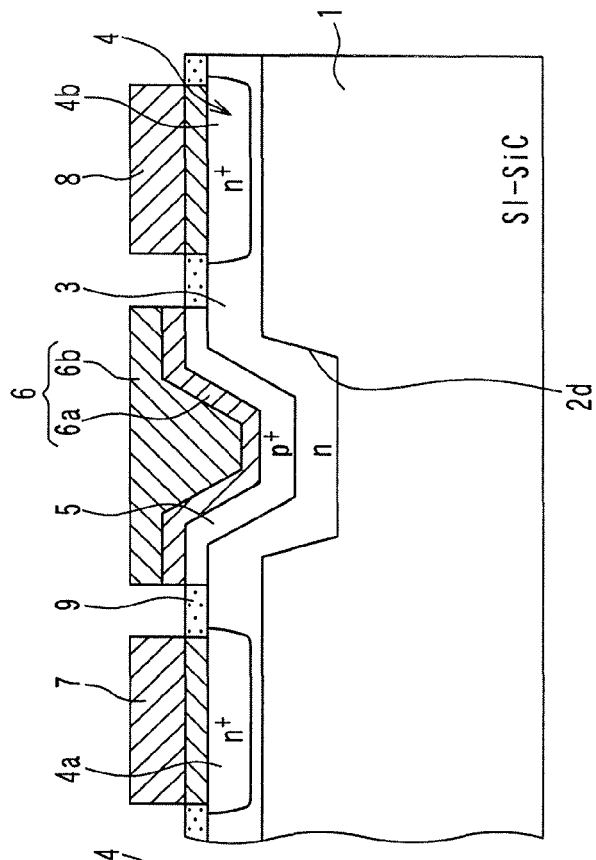
FIGS. 8A and 8B are diagrams showing a cross sectional view of a SiC semiconductor device having a D mode JFET and a E mode JFET according to a third embodiment.
Figure 8B:
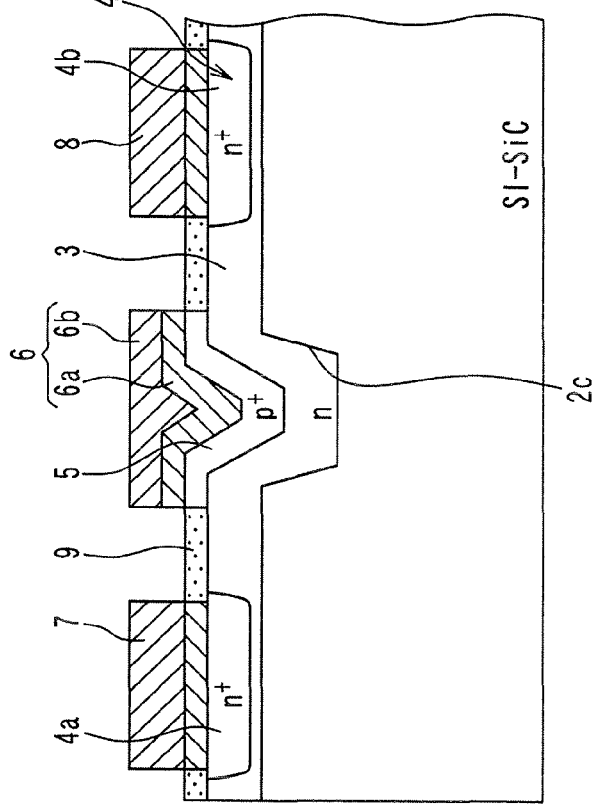

FIGS. 8A and 8B show the SiC semiconductor device having the D mode JFET and the E mode JFET according to the present embodiment. As shown in FIG. 8, a first concavity 2c is formed in a channel-to-be-formed region of the D mode JFET region. Further, a second concavity 2d is formed in a channel-to-be-formed region of the E mode JFET. These concavities 2c, 2d are formed by selectively etching the surface of the substrate 1.

The width of the concavity 2c is different from the width of the concavity 2d. Specifically, the width of the concavity 2c is narrower than the width of the concavity 2d. For example, the width of the first concavity 2c is in a range between 0.1 and 1.0 micrometers. Specifically, the width of the first concavity 2c is 0.5 micrometers. The width of the second concavity 2d is in a range between 0.5 and 2.0 micrometers. Specifically, the width of the second concavity 2d is 1.0 micrometers. Further, the length of the concavity 2c in a direction perpendicular to the drawing of FIGS. 8A and 8B is equal to the length of the concavity 2d.

Figure 9:
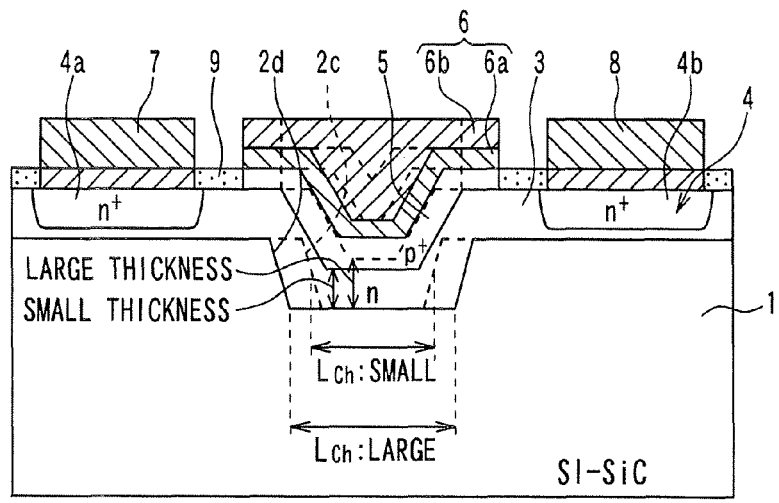
FIG. 9 is a diagram showing a cross sectional view of the device, in which a thickness of a N conductive type channel layer in a concavity varies with a width of the concavity.

Thus, when the width of the first concavity 2c is different from the width of the second concavity 2d, a thickness of the channel layer 3 in the first and second concavities 2c, 2d is changed according to the width of the first and second concavities 2c, 2d when the channel layer 3 is epitaxially grown in the concavities 2c, 2d. FIG. 9 shows a schematic view of this feature. In FIG. 9, a solid line represents the E mode JFET, and a dotted line represents the D mode JFET. As shown in FIG. 9, the channel layer 3 is formed on the concavity 2c having the narrow width such that the thickness of the channel layer 3 is large, and the channel layer 3 is formed in the concavity 2d having the wide width such that the thickness of the channel layer 3 is small. This is because a migration effect provides these features when the channel layer 3 is deposited. Since the thickness of the channel layer 3 in the concavity 2c is different from the thickness of the channel layer 3 in the concavity 2d, the depletion layer extending in the channel layer 3 completely pinches off the channel layer 3 in the E mode JFET having a small thickness of the channel layer 3 when the gate voltage is not applied to the gate region 5. When the gate voltage is not applied to the gate region 5, the depletion layer extending in the channel layer 3 does not completely pinch off the channel layer 3 in the D mode JFET having a large thickness of the channel layer 3.

Thus, since the width of the concavity 2c in the D mode JFET is different from the width of the concavity 2d in the E mode JFET so that the thickness of the channel layer 3 in the concavity 2c is different from the thickness of the channel layer 3 in the concavity 2d, the effects similar to the first embodiment are obtained.

In the SiC semiconductor device according to the present embodiment, the concavities 2c, 2d are formed at the same time, instead of the concavity 2a and the convexity 2b in the device according to the first embodiment. Thus, the manufacturing method according to the second embodiment is similar to the manufacturing method according to the first embodiment.

In the SiC semiconductor device according to the present embodiment, the properties of the D mode JFET and the E mode JFET are studied. The results of the properties are shown in FIGS. 10 to 14. Here, in the D mode JFET, a channel length $L_{CH}$ is 0.5 micrometers, a length $L_{SG}$ between the source and the gate is 0.5 micrometers, and a length $L_{GD}$ between the gate and the drain is 0.5 micrometers. In the E mode JFET, a channel length $L_{CH}$ is 1.0 micrometer, a length $L_{SG}$ between the source and the gate is 0.5 micrometers, and a length $L_{GD}$ between the gate and the drain is 0.5 micrometers.

Figure 10:
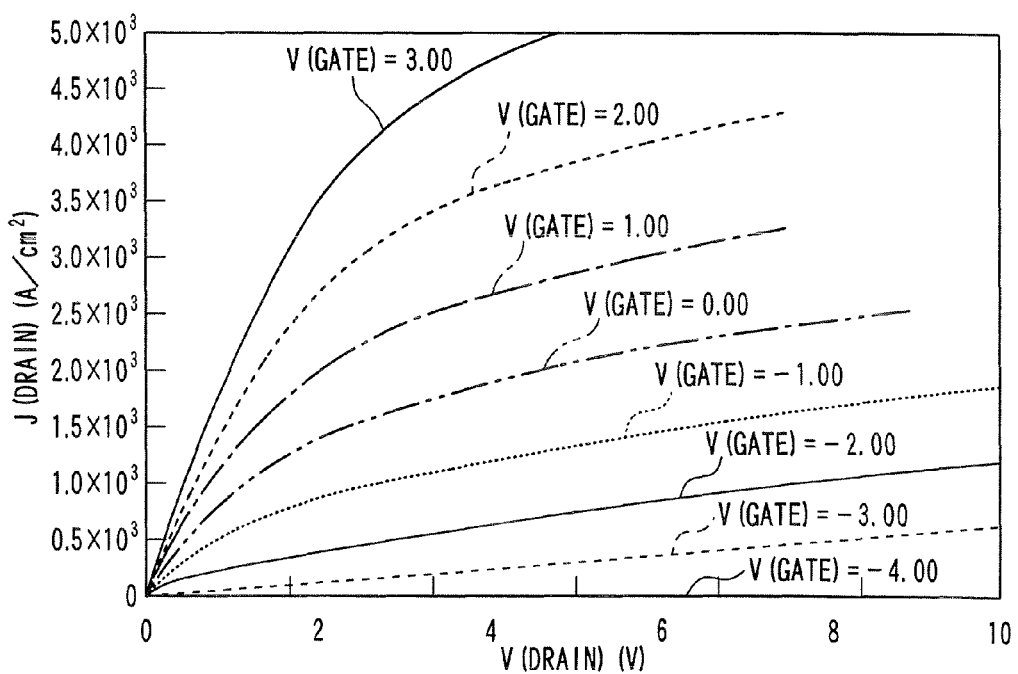
FIG. 10 is a graph showing a relationship between a drain voltage and a current density of a drain current in a D mode JFET at various gate voltages.
Figure 11:
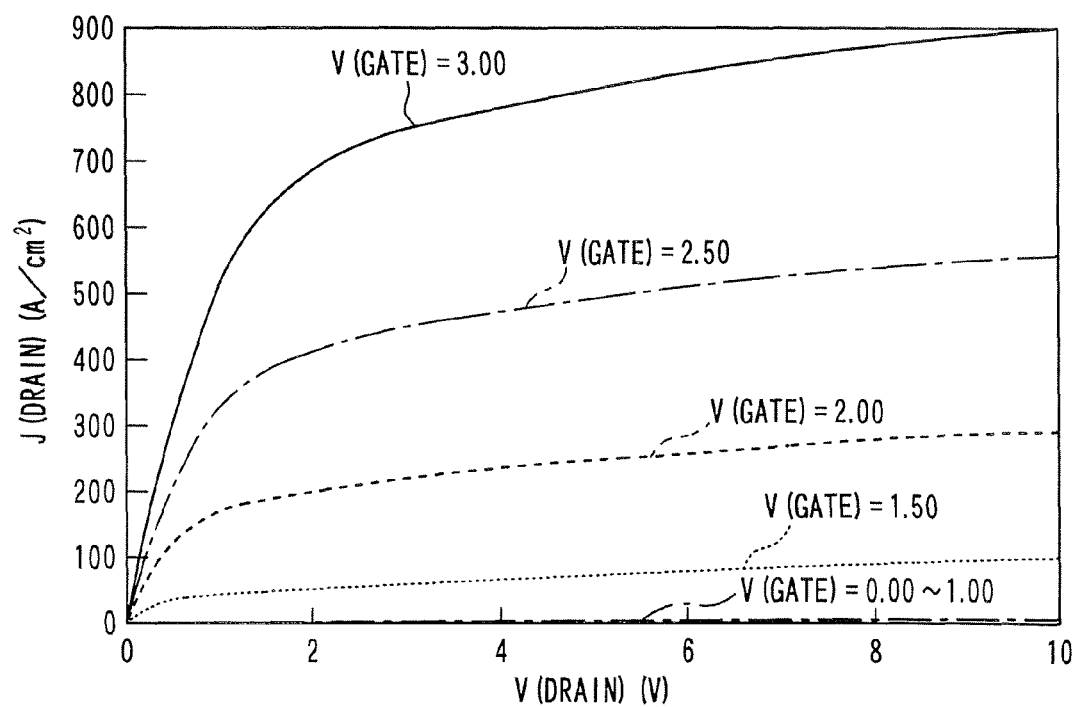
FIG. 11 is a graph showing a relationship between a drain voltage and a current density of a drain current in a E mode JFET at various gate voltages.

FIGS. 10 and 11 show a relationship between the drain voltage V(DRAIN) and the current density J(DRAIN) of the drain current at various gate voltage V(GATE) in the D mode JFET and the E mode JFET, respectively.

As shown in FIG. 10, in the D mode JFET, when the drain voltage V(DRAIN) becomes large, the current density J(DRAIN) increases. When the gate voltage V(GATE) is a potential (i.e., −4 volts), which is supposed to be the turn-off voltage of the D mode JFET, the current density J(DRAIN) becomes zero. Further, when the gate voltage V(GATE) becomes large, the current density J(DRAIN) increases. Thus, the properties of the D mode JFET are obtained surely. As shown in FIG. 11, in the E mode JFET, when the drain voltage V(DRAIN) becomes large, the current density J(DRAIN) increases. When the gate voltage V(GATE) is a potential (i.e., 0 volt), which is supposed to be the turn-off voltage of the E mode JFET, the current density J(DRAIN) becomes zero. Further, when the gate voltage V(GATE) becomes large, the current density J(DRAIN) increases. Thus, the properties of the E mode JFET are obtained surely. Accordingly, the D mode JFET provides the D mode properties clearly, and the E mode JFET provides the E mode properties clearly.

Figure 12:
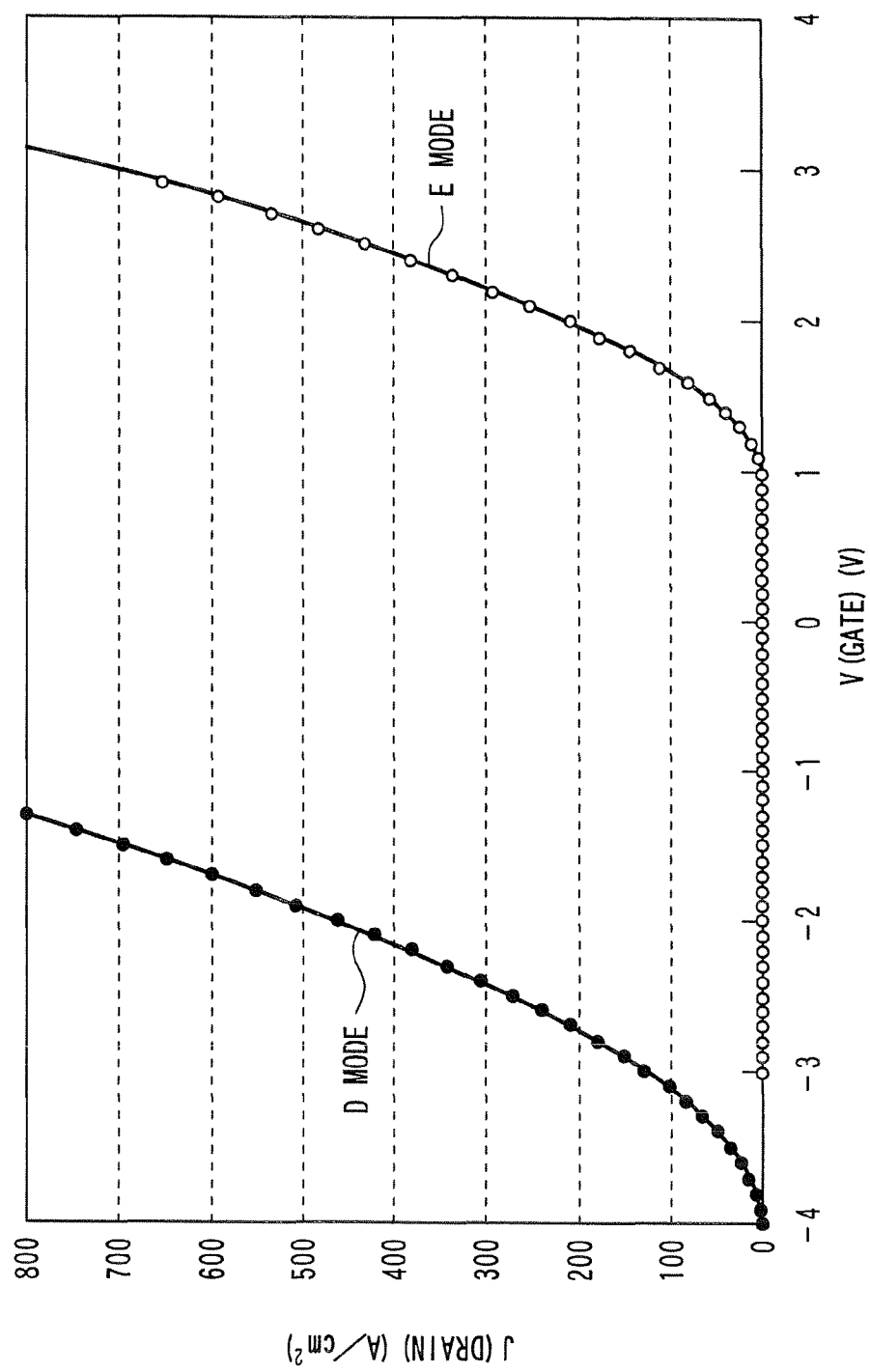
FIG. 12 is a graph showing a relationship between the gate voltage and the current density of the drain current in each of the D mode JFET and the E mode JFET.

FIG. 12 shows a relationship between the gate voltage V(GATE) and the current density J(DRAIN) of the drain current in each of the D mode JFET and the E mode JFET. As shown in FIG. 12, in the D mode JFET, when the negative gate voltage V(GATE) exceeds the potential supposed to be the turn-off voltage of the D mode JFET, the current density J(DRAIN) increases exponentially. In the E mode JFET, when the gate voltage V(GATE) exceeds a predetermined positive threshold voltage, the current density J(DRAIN) increases exponentially. Thus, regarding the current density J(DRAIN) of the drain current with respect to the gate voltage V(GATE), the D mode JFET provides appropriate D mode properties, and the E mode JFET provides appropriate E mode properties.

Figure 13A:
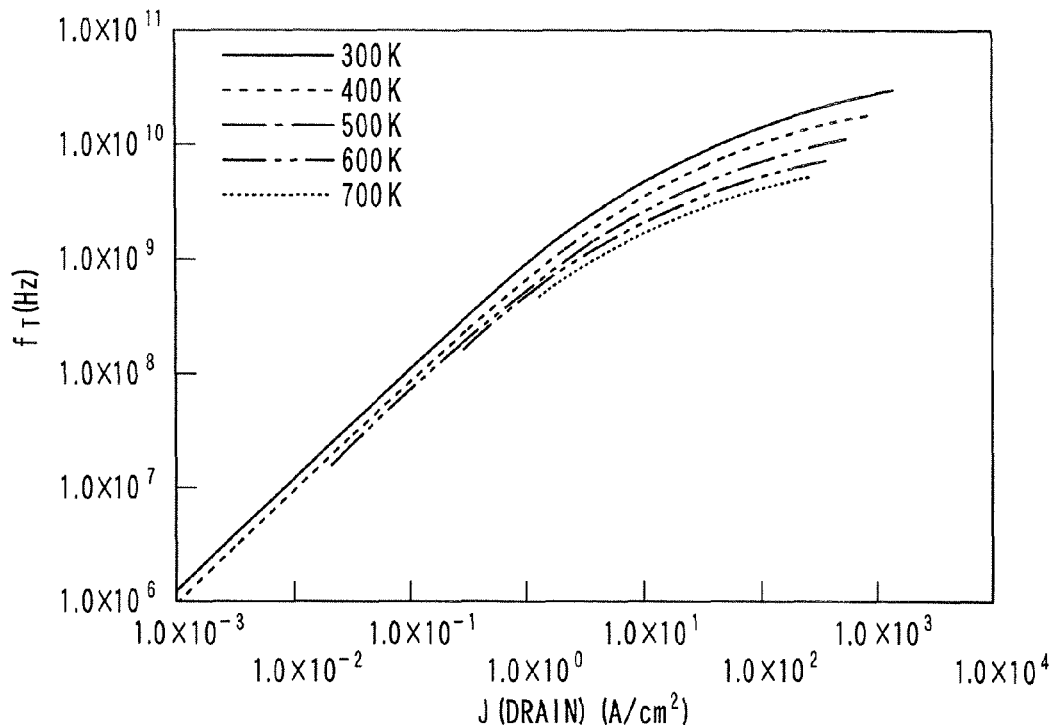
FIG. 13A is a graph showing a relationship between the current density of the drain current and the cut-off frequency at various temperature in the D mode JFET.
Figure 13B:
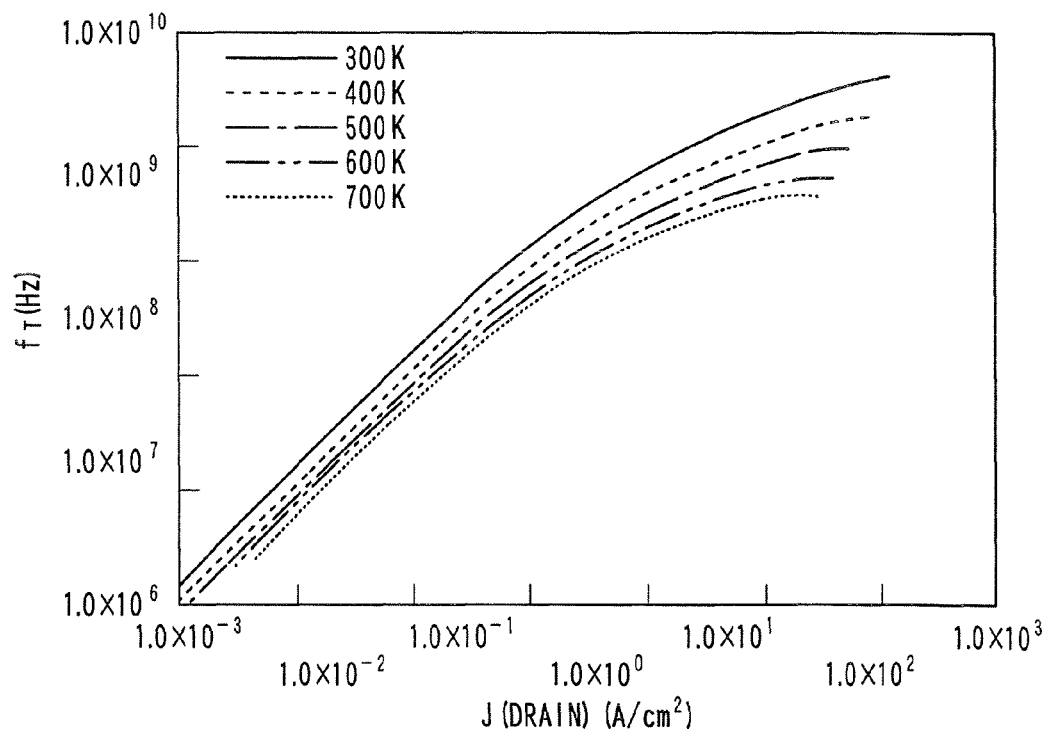
FIG. 13B is a graph showing a relationship between the current density of the drain current and the cut-off frequency at various temperature in the E mode JFET.
Figure 14:
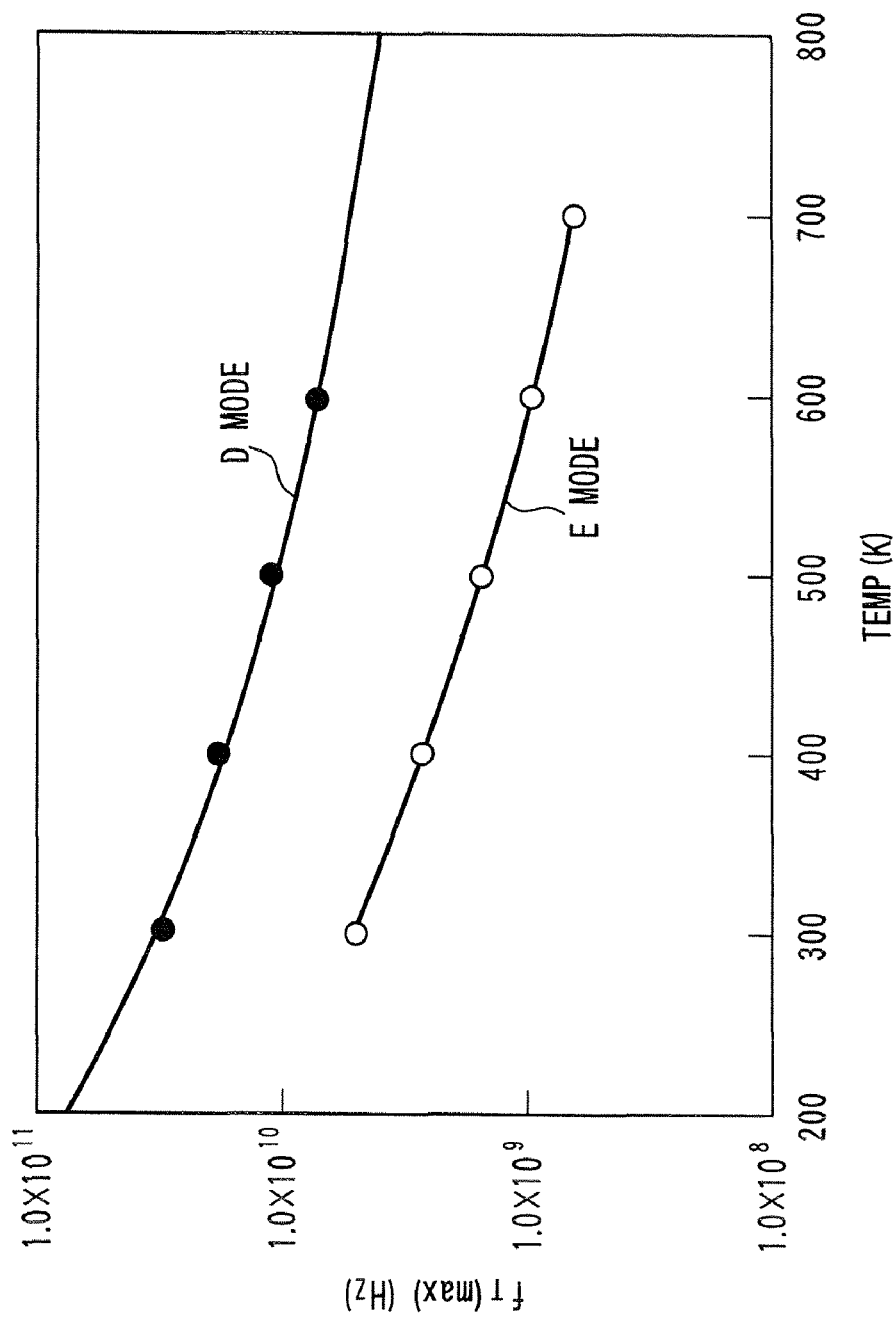
FIG. 14 is a graph showing a relationship between temperature and the maximum value of the cut-off frequency in each of the D mode JFET and the E mode JFET.

FIGS. 13A and 13B show a relationship between the current density J(DRAIN) and the cut-off frequency $f_T$ in the D mode JFET and the E mode JFET at various application temperature of the SiC semiconductor device. FIG. 14 shows a relationship between the application temperature of the SiC semiconductor device and the maximum value $f_T$(max) of the cut-off frequency.

As shown in FIGS. 13A to 14, the change of the cut-off frequency $f_T$ with respect to the current density J(DRAIN) is measured in a temperature range between 300K and 700K. At all temperature range, the high cut-off frequency $f_T$ is obtained. Specifically, at a room temperature (i.e., 300K), the cut-off frequency $f_T$ is about 10 GHz. At high temperature (i.e., 700K), the cut-off frequency $f_T$ is sufficiently high. Accordingly, in the SiC semiconductor device having the D mode JFET and the E mode JFET according to the present embodiment, each of the D mode JFET and the E mode JFET provides a sufficiently high cut-off frequency $f_T$, and therefore, the device is suitably used for high frequency.

Fourth Embodiment

A fourth embodiment will be explained. A SiC semiconductor device according to the present embodiment includes a P conductive type buffer layer.

Figures 15A, 15B:
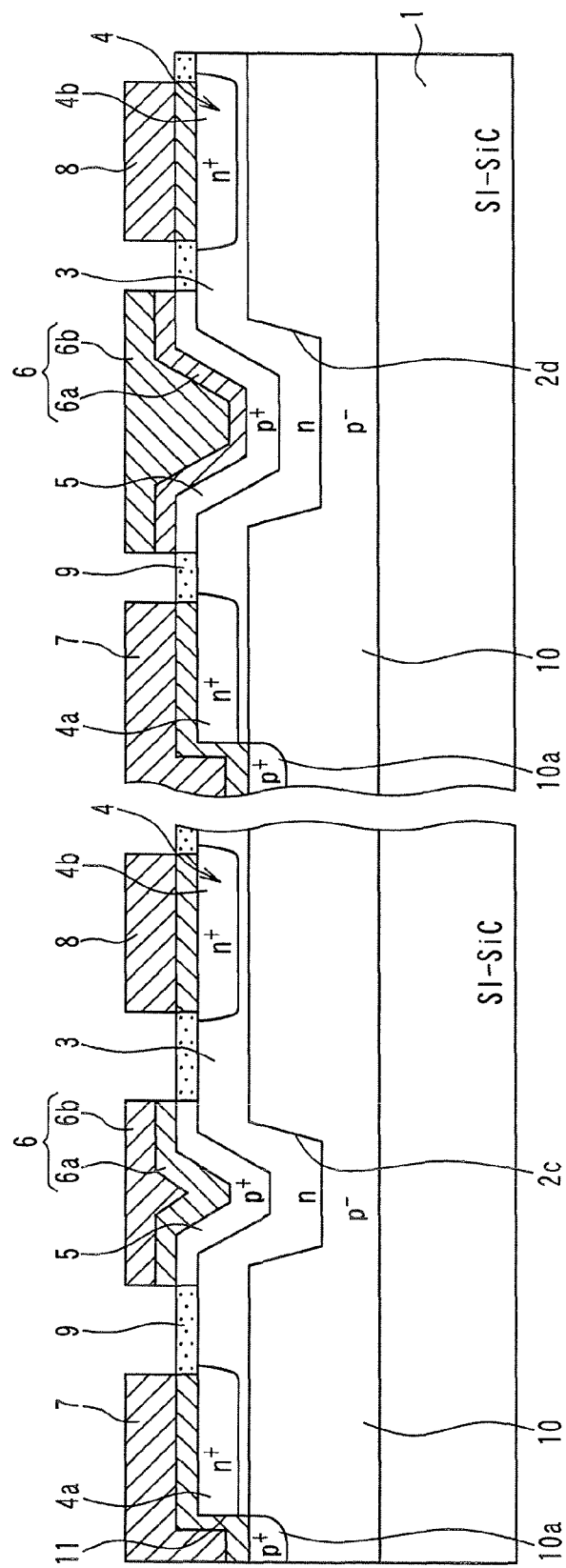
FIGS. 15A and 15B are diagrams showing a cross sectional view of a SiC semiconductor device having a D mode JFET and a E mode JFET according to a fourth embodiment.

FIGS. 15A and 15B show the SiC semiconductor device having the D mode JFET and the E mode JFET according to the present embodiment. As shown in FIGS. 15A and 15B, in the present embodiment, the P conductive type buffer layer 10 having an impurity concentration lower than the gate region 5 is formed on the surface of the SiC substrate 1. The channel layer 3 is formed on the surface of the buffer layer 10. The buffer layer 10 according to the present embodiment has a similar construction as the buffer layer 10 according to the second embodiment. The buffer layer 10 provides a high breakdown voltage. A P conductive type contact region 10a having the high impurity concentration is formed in the buffer layer 10. A concavity 11 for exposing the contact region 10a on the bottom of the concavity 11 is formed to penetrate the source region 4a. The concavity 11 is disposed under the source electrode 7. The source electrode 7 is embedded in the concavity 11. Thus, the buffer layer 10 is electrically coupled with the source electrode 7 via the contact region 10a, so that the buffer layer 10 is fixed to the ground potential.

In the above structure, basically, the effects similar to the third embodiment are obtained. Since the device includes the buffer layer 10, compared with the device according to the third embodiment, the breakdown voltage of the device according to the present embodiment is higher than that according to the third embodiment. Since the device includes the buffer layer 10, the buffer layer 10 absorbs the electric wave generated in case of operation of the JFET. Thus, the SIC semiconductor device is suitably used for high frequency.

The manufacturing method of the above structure of the SiC semiconductor device is basically similar to the manufacturing method of the third embodiment. Different from the third embodiment, since the device includes the buffer layer 10, the manufacturing method further includes a step for forming the buffer layer 10 on the surface of the substrate 1, and the concavities 2c, 2d in the D mode JFET and the E mode JFET are formed in the buffer layer 10.

Fifth Embodiment

A fifth embodiment will be explained. A SiC semiconductor device according to the present embodiment has the construction of the D mode JFET and the E mode JFET, which is different from the first embodiment.

Figure 16A:
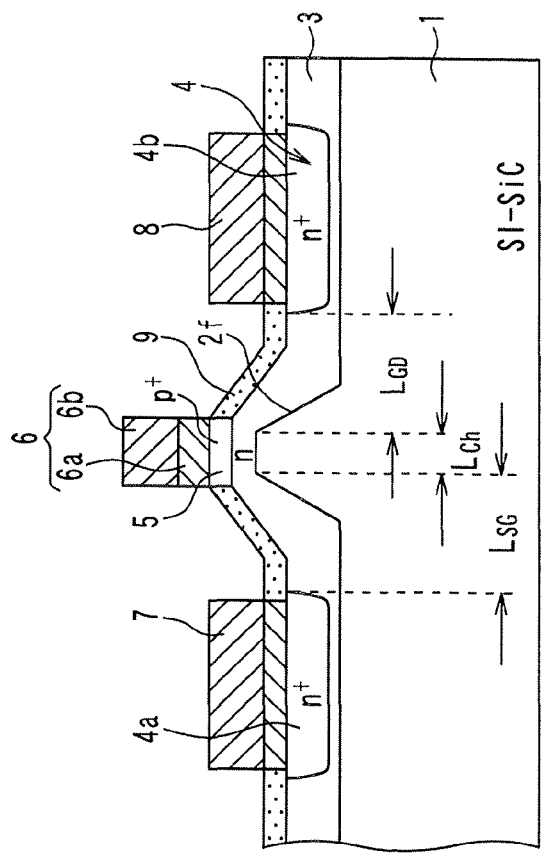
FIGS. 16A and 16B are diagrams showing a cross sectional view of a SiC semiconductor device having a D mode JFET and a E mode JFET according to a fifth embodiment.
Figure 16B:
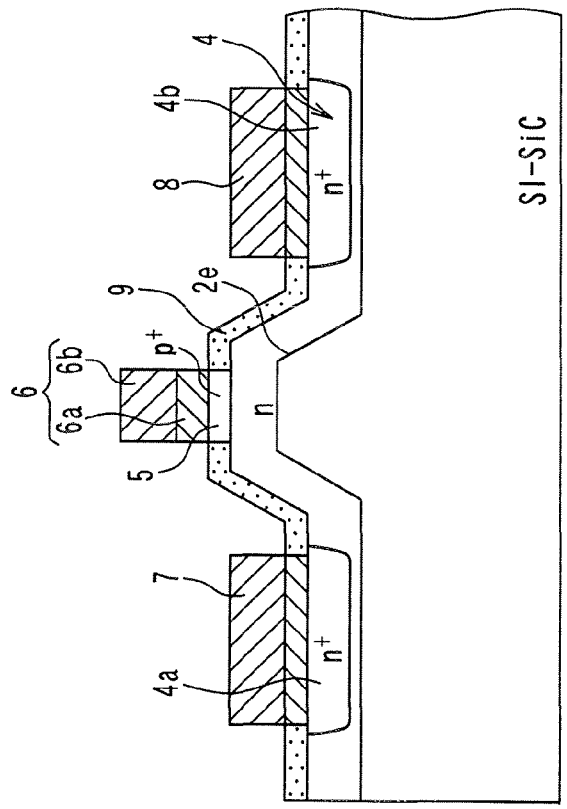

FIGS. 16A and 16B show the SIC semiconductor device having the D mode JFET and the E mode JFET according to the present embodiment. As shown in FIGS. 16A and 16B, a convexity 2e as the first convexity is formed in a channel-to-be-formed region of the substrate 1 in the D mode JFET region. A convexity 2f as the second convexity is formed in a channel-to-be-formed region of the substrate 1 in the E mode JFET region. These convexities 2e, 2f are formed on the surface of the substrate 1 by a selective etching process.

The width of the convexity 2e is different from the width of the convexity 2f. Specifically, the width of the convexity 2e is wider than the width of the convexity 2f. For example, the width of the convexity 2e is in a range between 0.5 and 2.0 micrometers. Specifically, the width of the convexity 2e is 0.75 micrometers. The width of the convexity 2f is in a range between 0.1 and 1.0 micrometers. Specifically, the width of the convexity 2e is 0.5 micrometers. The convexities 2e, 2f extend in a direction perpendicular to the drawing of FIGS. 16A and 16B. A length of the convexity 2e in the direction perpendicular to the drawing of FIG. 16A is equal to the length of the convexity 2f in the direction perpendicular to the drawing of FIG. 16B.

Thus, when the width of the convexity 2e is different from the width of the convexity 2f, the thickness of the channel layer 3 epitaxially grown on the convexities 2e, 2f is varied according to the width of the convexities 2e, 2f. Thus, the thickness of the channel layer 3 on the convexity 2e having a wide width is large, and the thickness of the channel layer 3 on the convexity 2f having a narrow width is small. This is provided by the migration when the channel layer 3 is deposited. Thus, since the thickness of the channel layer 3 on the convexity 2e is different from the thickness of the channel layer 3 on the convexity 2f, the depletion layer extending in the channel layer 3 completely pinches off the channel layer 3 in the E mode JFET having the channel layer 3 with the large thickness, and the depletion layer extending in the channel layer 3 does not completely pinch off the channel layer 3 in the D mode JFET having the channel layer 3 with the small thickness.

Thus, since the width of the convexities 2e, 2f in the D mode JFET and the E mode JFET is varied so that the thickness of the channel layer 3 on the convexities 2e, 2f is changed, the effects similar to the first embodiment are obtained.

In the above SiC semiconductor device, the convexities 2e, 2f instead of the concavity 2a and the convexity 2b are 1 formed simultaneously. Thus, the manufacturing method of the SiC semiconductor device according to the present embodiment is similar to the manufacturing method of the first embodiment.

Sixth Embodiment

A sixth embodiment will be explained. A SiC semiconductor device according to the present embodiment includes a P conductive type buffer layer, which is different from the device according to the fifth embodiment.

Figure 17A:
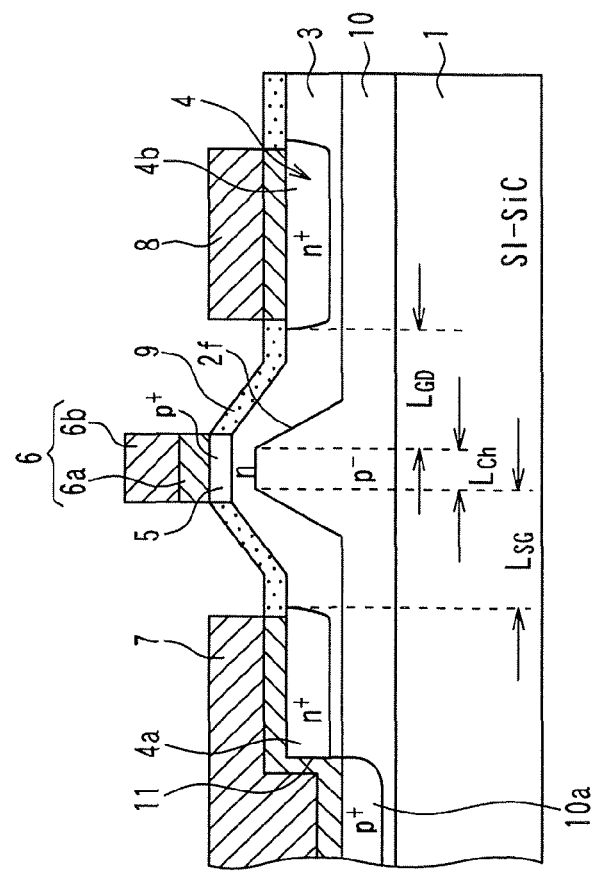
FIGS. 17A and 17B are diagrams showing a cross sectional view of a SiC semiconductor device having a D mode JFET and a E mode JFET according to a sixth embodiment.
Figure 17B:
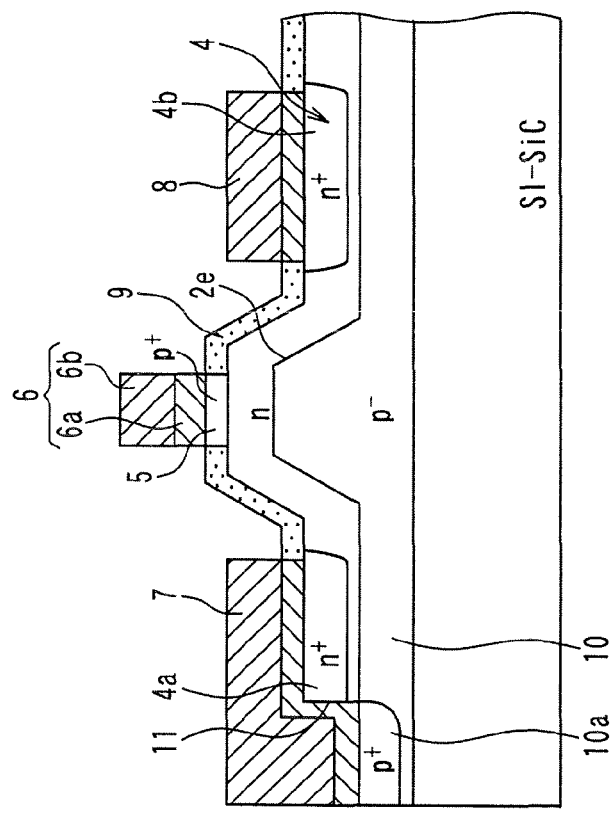

FIGS. 17A and 17B show the SiC semiconductor device having the D mode JFET and the E mode JFET. As shown in FIGS. 17A and 17B, in the present embodiment, the P conductive type buffer layer 10 having an impurity concentration lower than the gate region 5 is formed on the surface of the substrate 1. The channel layer 3 is formed on eth surface of the buffer layer 10. The buffer layer 10 has the structure similar to the second embodiment. The buffer layer 10 provides a high breakdown voltage of the device. A P conductive type contact region 10a having the high impurity concentration is formed in the buffer layer 10. The concavity 11 for exposing the contact region 10a on the bottom of the concavity 11 is formed such that the concavity 11 penetrates the source region 4a, and the concavity 11 is disposed under the source electrode 7. The source electrode 7 is embedded in the concavity 11, so that the buffer layer 10 is coupled with the source electrode 7 via the contact region 10a. Thus, the buffer layer 10 is fixed to the ground potential.

In the above structure, basically, the effects similar to the fifth embodiment are obtained. Further, the device according to the present embodiment includes the buffer layer 10, which is different from the device of the fifth embodiment. Thus, the breakdown voltage of the device according to the present embodiment is higher than that according to the fifth embodiment. Furthermore, since the device includes the buffer layer 10, the buffer layer 10 absorbs the electric wave generated in case of the operation of the JFET. Thus, the device is suitably used for high frequency.

In the above structure of the SiC semiconductor device according to the present embodiment, basically, the manufacturing method of the device according to the present embodiment is similar to the manufacturing method of the fifth embodiment. Since the device includes the buffer layer 10, which is different from the device according to the fifth embodiment, the manufacturing method further includes a step for forming the buffer layer 10 on the substrate 1, and the convexities 2e, 2f in the D mode JFET and the E mode JFET are formed in the buffer layer 10.

Seventh Embodiment

A seventh embodiment will be explained. A SiC semiconductor device according to the present embodiment includes the source region 4a and the drain region 4b having a different structure from the device according to the first embodiment.

Figure 18A:
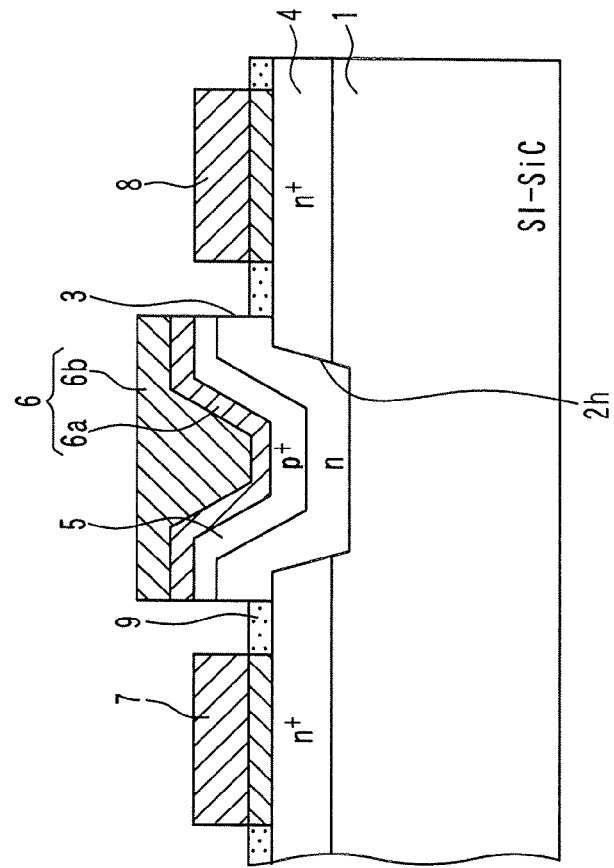
FIGS. 18A and 18B are diagrams showing a cross' sectional view of a SIC semiconductor device having a D mode JFET and a E mode JFET according to a seventh embodiment.
Figure 18B:
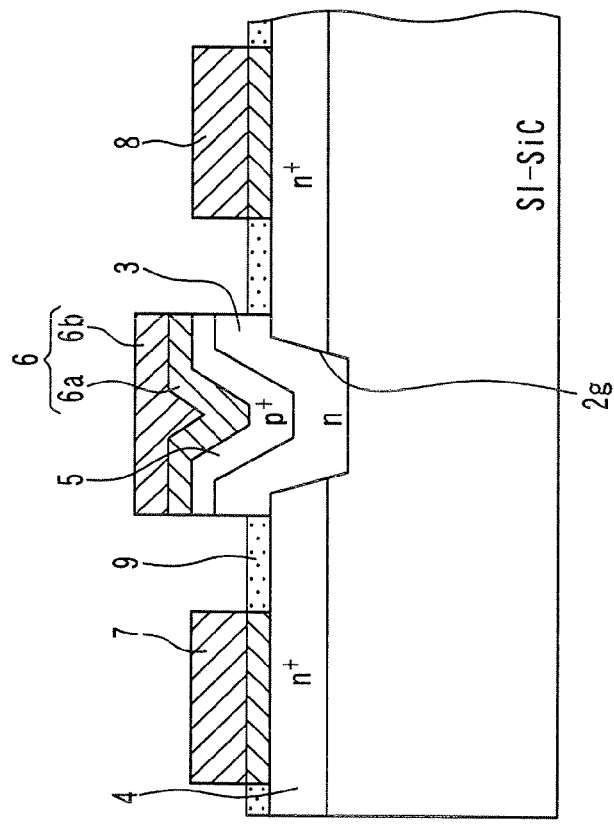

FIGS. 18A and 18B show the SiC semiconductor device having the D mode JFET and the E mode JFET according to the present embodiment. As shown in FIGS. 18A and 18B, in the present embodiment, a N conductive type layer 4 is epitaxially grown on the surface of the substrate 1. The N conductive type layer 4 is divided into a right side N conductive type layer 4 and a left side N conductive type layer 4 by the concavity 2g, 2h in each of the D mode JFET and the E mode JFET, so that the source region 4a and the drain region 4b are formed in the D mode JFET and the E mode JFET, respectively. The width and the like of the concavity 2g for providing the D mode JFET and the width and the like of the concavity 2h for providing the E mode JFET are similar to those of the concavities 2c, 2d in FIGS. 8A and 8b according to the third embodiment. The channel layer 3 is epitaxially grown in the concavities 2g, 2h, so that the thickness of the channel layer 3 in the concavity 2g is different from the thickness of the channel layer 3 in the concavity 2h. Then, the gate region 5 and the gate electrode 6 are formed on the channel layer 3. The gate electrode 6 functions as a mask so that the gate region 5 and the channel layer 3 are patterned. Then, the source electrode 7 and the drain electrode 8 are formed by steps similar to the first embodiment. Thus, the SiC semiconductor device according to the present embodiment is completed.

Thus, the source region 4a and the drain region 4b may be epitaxially grown on the substrate 1. The SiC semiconductor device having the D mode JFET and the E mode JFET has the effects similar to the first embodiment.

Eighth Embodiment

An eighth embodiment will be explained. A SiC semiconductor device according to the present embodiment includes the P conductive type buffer layer, which is different from the device according to the seventh embodiment.

Figures 19A, 19B:
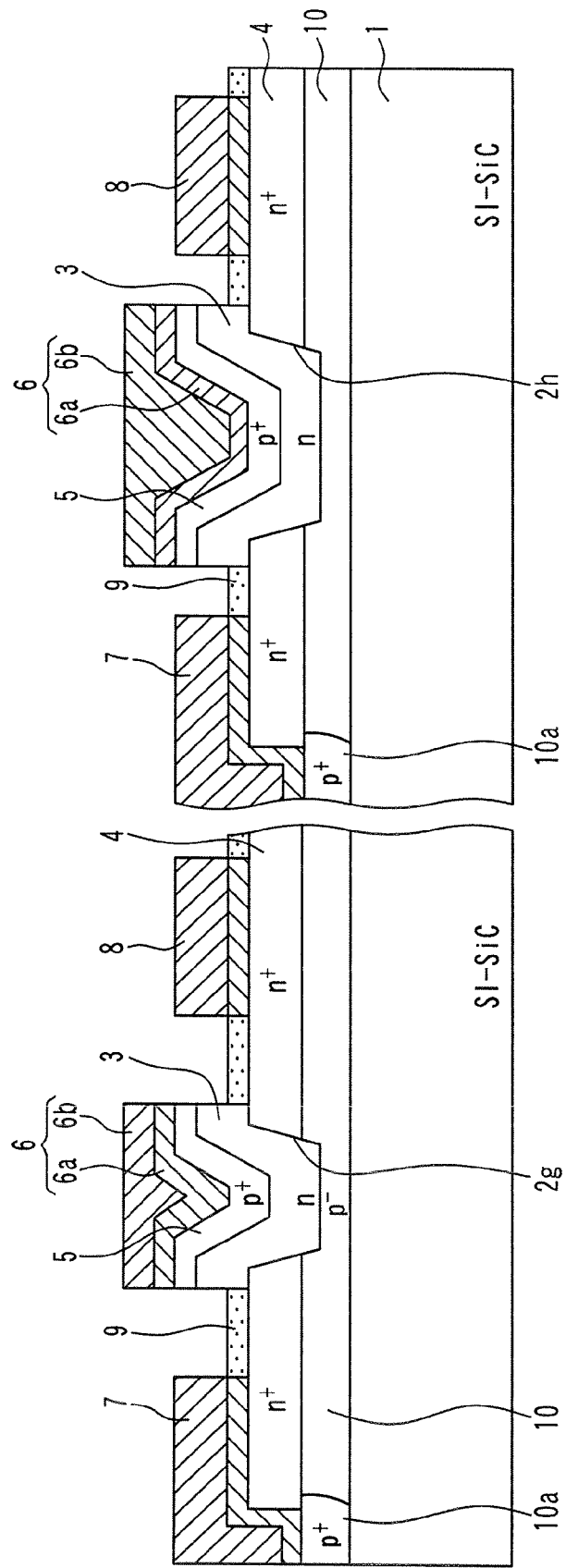
FIGS. 19A and 19B are diagrams showing a cross sectional view of a SiC semiconductor device having a D mode JFET and a E mode JFET according to a eighth embodiment.
Figure 20B:
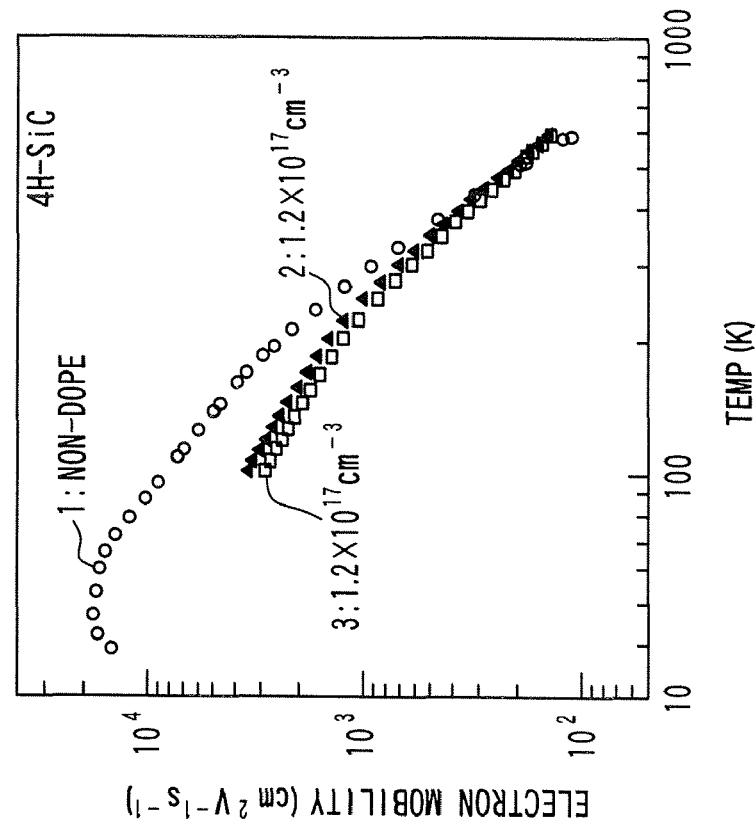
FIGS. 20A and 20B are graphs showing temperature dependency of an electron mobility at various impurity concentration in a channel layer in 6H—SiC and 4H—SiC, respectively.
Figure 20A:
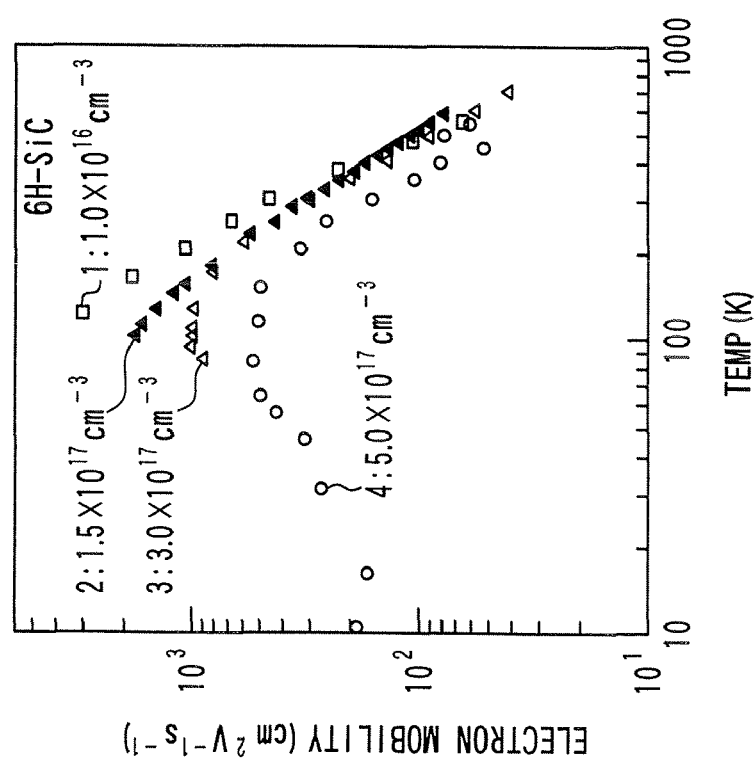
Figure 21:
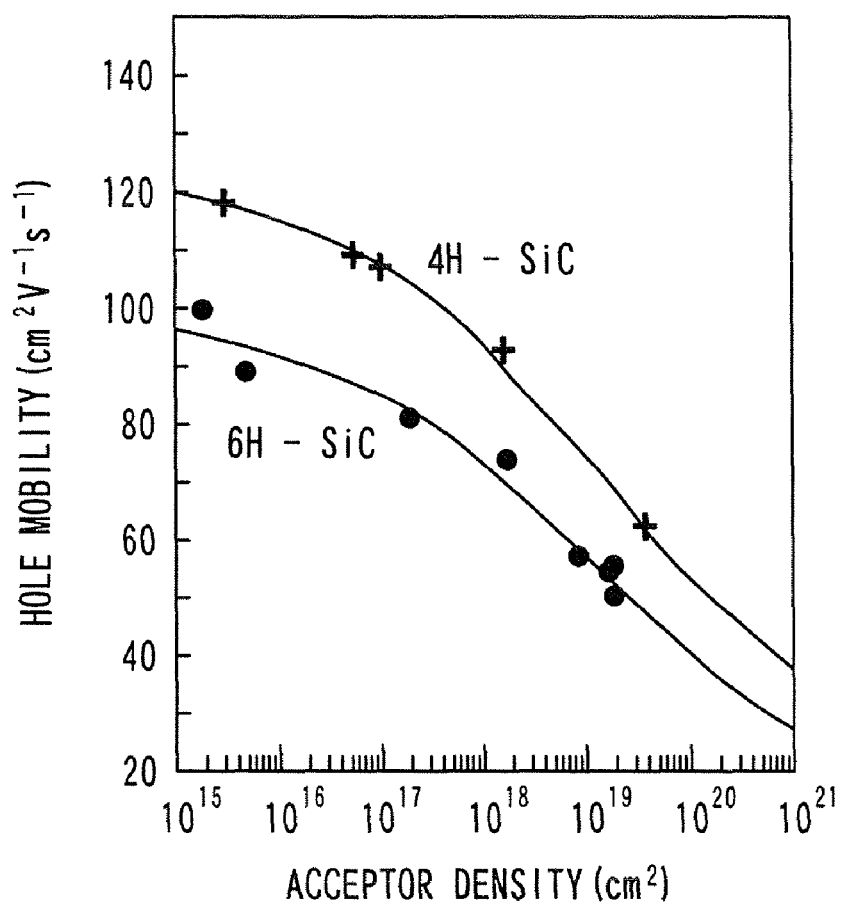
FIG. 21 is a graph showing a relationship between a hole mobility and an acceptor density in each of 6H—SiC and 4H—SiC.

FIGS. 19A and 19B shows a SiC semiconductor device having the D mode JFET and the E mode JFET according to the present embodiment. As shown in FIGS. 19A and 19B, in the present embodiment, the buffer layer 10 having an impurity concentration lower than the gate region 5 is formed on the surface of the substrate 1. The source region 4a, the drain region 4b and the channel layer 3 are formed on the buffer layer 10. The buffer layer 10 has the structure similar to the second embodiment. The buffer layer 10 provides a high breakdown voltage. The contact region 10a having the high impurity concentration is formed in the buffer layer 10. The concavity 11 for exposing the contact region 10a on the bottom of the concavity 11 is formed such that the concavity 11 penetrates the source region 4a, and the concavity 11 is disposed under the source electrode 7. The source electrode 7 is embedded in the concavity 11. Thus, the buffer layer 10 is coupled with the source electrode 7 via the contact region 10a. Thus, the buffer layer 10 is fixed to the ground potential.

In the above structure, basically, the effects similar to the fifth embodiment are obtained. Further, since the device according to the present embodiment includes the buffer layer 10, which is different from the device according to the fifth embodiment, the breakdown voltage of the device according to the present embodiment is higher than that of the fifth embodiment. Further, since the device includes the buffer 10, the buffer layer absorbs the electric wave generated in case of the operation of the JFET. Thus, the device according to the present embodiment is suitably used for high frequency.

The manufacturing method of the device according to the present embodiment is basically similar to the manufacturing method of the device according to the fifth embodiment. Since the device according to the present embodiment includes the buffer layer 10, which is different from the fifth embodiment, the manufacturing method according to the present embodiment further includes a step for forming the buffer layer 10 on the surface of the substrate 1, and the concavities 2g, 2h in the D mode JFET and the E mode JFET are formed in the buffer layer 10.

Other Embodiments

In the above embodiments, the N conductive type channel layer 3 provides the channel, so that the N channel type JFET is formed. Alternatively, the N conductive type may be replace to the P conductive type, and the P conductive type may be replace to the N conductive type, so that a P channel type JFET is formed.

In the above embodiments, the gate electrode 6, the source electrode 7 and the drain electrode 8 have a three-layered structure. Thus, they are formed from a Ni series metal layer, the Ti series metal layer and the aluminum layer or the gold layer, which are stacked in this order. Alternatively, they may be formed from a stacking structure of Ni/Ti/Mo/Au, a stacking structure of Ti/Mo/Ni/Au, a stacking structure of Ni/Mo/Ti, a stacking structure of Ti/Mo/Ni, a combination of Ti/Mo, a structure of Ti/Mo, or a structure of Ni/Mo. Alternatively, they may be formed from a single layer such as a Ti layer and a Ni layer.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:
1. A semiconductor device comprising:
a substrate having a first surface and made of semiconductor material; and
a depletion mode JFET and an enhancement mode JFET, which are disposed in the substrate,
wherein the depletion mode JFET includes:
a concavity disposed on the first surface of the substrate;

a channel layer epitaxially grown on the substrate and having a first conductive type, wherein the channel layer is disposed in the concavity;

a first gate region epitaxially grown on the channel layer and having a second conductive type;

a first source region and a first drain region disposed on respective sides of the first gate region in the channel layer, wherein each of the first source region and the first drain region has the first conductive type and an impurity concentration higher than the channel layer;

a first gate electrode electrically coupled with the first gate region;

a first source electrode electrically coupled with the first source region; and a first drain electrode electrically coupled with the first drain region, wherein the enhancement mode JFET includes:

a convexity disposed on the first surface of the substrate;

the channel layer disposed on the convexity;

a second gate region epitaxially grown on the channel layer and having a second conductive type;

a second source region and a second drain region disposed on respective sides of the second gate region in the channel layer, wherein each of the second source region and the second drain region has the first conductive type and an impurity concentration higher than the channel layer;

a second gate electrode electrically coupled with the second gate region;

a second source electrode electrically coupled with the second source region; and a second drain electrode electrically coupled with the second drain region, and wherein a thickness of the channel layer in the concavity is larger than a thickness of the channel layer on the convexity.

2. The semiconductor device according to claim 1, wherein a width of a bottom of the concavity along with a direction from the first source region to the first drain region of the depletion mode JFET is in a range between 0.1 and 1.0 micrometers, and wherein a width of a top of the convexity along with a direction from the second source region to the second drain region of the enhancement mode JFET is in a range between 0.5 and 2.0 micrometers.

3. The semiconductor device according to claim 1, further comprising:

a buffer layer disposed between the substrate and the channel layer, wherein the buffer layer has the second conductive type and an impurity concentration lower than the first and second gate regions, and wherein the concavity and the convexity are disposed on the buffer layer.

4. The semiconductor device according to claim 1, wherein the semiconductor material is wide gap semiconductor material.

5. The semiconductor device according to claim 4, wherein the wide gap semiconductor material is SIC, and wherein the substrate is a SiC substrate.

6. The semiconductor device according to claim 1, wherein the depletion mode JFET has a first channel length and a first channel width, wherein the enhancement mode JFET has a second channel length and a second channel width, and wherein the first channel length is equal to the second channel length, and the first channel width is equal to the second channel width.

7. The semiconductor device according to claim 6, wherein the first channel length is a width of a bottom of the concavity along with a direction from the first source region to the first drain region of the depletion mode JFET, wherein the second channel length is a width of a top of the convexity along with a direction from the second source region to the second drain region of the enhancement mode JFET, wherein the first channel width is a length along with a direction in parallel to the first surface of the substrate and perpendicular to the direction from the source region to the drain region of the depletion mode JFET, and wherein the second channel width is a length along with a direction in parallel to the first surface of the substrate and perpendicular to the direction from the source region to the drain region of the enhancement mode JFET.

8. The semiconductor device according to claim 1, wherein the channel layer in the concavity of the depletion mode JFET is concaved, wherein the gate region of the depletion mode JFET is disposed in a concaved channel layer, wherein each of the source region and the drain region in the depletion mode JFET is spaced apart from the concavity, wherein the channel layer on the convexity of the enhancement mode JFET protrudes, wherein the gate region of the enhancement mode JFET is disposed on a protruded channel layer, and wherein each of the source region and the drain region in the enhancement mode JFET is spaced apart from the convexity.

9. The semiconductor device according to claim 8, wherein a width of a bottom of the concavity along with a direction from the source region to the drain region of the depletion mode JFET is in a range between 0.1 and 1.0 micrometers, wherein a width of a top of the convexity along with a direction from the source region to the drain region of the enhancement mode JFET is in a range between 0.5 and 2.0 micrometers, wherein the bottom of the concavity has a concavity length along with a direction in parallel to the first surface of the substrate and perpendicular to the direction from the source region to the drain region of the depletion mode JFET, wherein the top of the convexity has a convexity length along with a direction in parallel to the first surface of the substrate and perpendicular to the direction from the source region to the drain region of the enhancement mode JFET, and wherein the concavity length is equal to the convexity length.

10. A semiconductor device comprising:

a substrate having a first surface and made of semiconductor material; and a depletion mode JFET and an enhancement mode JFET, which are disposed in the substrate, wherein the depletion mode JFET includes:

a first concavity disposed on the first surface of the substrate;

a channel layer epitaxially grown on the substrate and having a first conductive type, wherein the channel layer is disposed in the first concavity;

a first gate region epitaxially grown on the channel layer and having a second conductive type;

a first source region and a first drain region disposed on respective sides of the first gate region in the channel layer, wherein each of the first source region and the first drain region has the first conductive type and an impurity concentration higher than the channel layer;

a first gate electrode electrically coupled with the first gate region;

a first source electrode electrically coupled with the first source region; and a first drain electrode electrically coupled with the first drain region, wherein the enhancement mode JFET includes:
a second concavity disposed on the first surface of the substrate;
the channel layer disposed in the second concavity;
a second gate region epitaxially grown on the channel layer and having a second conductive type;
a second source region and a second drain region disposed on respective sides of the second gate region in the channel layer, wherein each of the second source region and the second drain region has the first conductive type and an impurity concentration higher than the channel layer;
a second gate electrode electrically coupled with the second gate region;
a second source electrode electrically coupled with the second source region; and
a second drain electrode electrically coupled with the second drain region, wherein a bottom of the first concavity has a first width along with a direction from the first source region to the first drain region of the depletion mode JFET, wherein a bottom of the second concavity has a second width along with a direction from the second source region to the second drain region of the enhancement mode JFET, wherein the second width is larger than the first width, and wherein a thickness of the channel layer in the second concavity is smaller than a thickness of the channel layer in the first concavity.

11. The semiconductor device according to claim 10,
wherein the first width is in a range between 0.1 and 1.0 micrometers, and
wherein the second width is in a range between 0.5 and 2.0 micrometers.

12. The semiconductor device according to claim 10, further comprising:
a buffer layer disposed between the substrate and the channel layer,
wherein the buffer layer has the second conductive type and an impurity concentration lower than the first and second gate regions, and
wherein the first concavity and the second concavity are disposed on the buffer layer.

13. A semiconductor device comprising:
a substrate having a first surface and made of semiconductor material; and
a depletion mode JFET and an enhancement mode JFET, which are disposed in the substrate,
wherein the depletion mode JFET includes:
a first convexity disposed on the first surface of the substrate;
a channel layer epitaxially grown on the substrate and having a first conductive type, wherein the channel layer is disposed on the first convexity;
a first gate region epitaxially grown on the channel layer and having a second conductive type;
a first source region and a first drain region disposed on respective sides of the first gate region in the channel layer, wherein each of the first source region and the first drain region has the first conductive type and an impurity concentration higher than the channel layer;
a first gate electrode electrically coupled with the first gate region;
a first source electrode electrically coupled with the first source region; and
a first drain electrode electrically coupled with the first drain region, wherein the enhancement mode JFET includes:
a second convexity disposed on the first surface of the substrate;
the channel layer disposed on the second convexity;
a second gate region epitaxially grown on the channel layer and having a second conductive type;
a second source region and a second drain region disposed on respective sides of the second gate region in the channel layer, wherein each of the second source region and the second drain region has the first conductive type and an impurity concentration higher than the channel layer;
a second gate electrode electrically coupled with the second gate region;
a second source electrode electrically coupled with the second source region; and
a second drain electrode electrically coupled with the second drain region, wherein a top of the first convexity has a first width along with a direction from the first source region to the first drain region of the depletion mode JFET, wherein a top of the second convexity has a second width along with a direction from the second source region to the second drain region of the enhancement mode JFET, wherein the second width is smaller than the first width, and wherein a thickness of the channel layer on the second convexity is smaller than a thickness of the channel layer on the first convexity.

14. The semiconductor device according to claim 13,
wherein the first width is in a range between 0.5 and 2.0 micrometer, and
wherein the second width is in a range between 0.1 and 1.0 micrometers.

15. The semiconductor device according to claim 13, further comprising:
a buffer layer disposed between the substrate and the channel layer,
wherein the buffer layer has the second conductive type and an impurity concentration lower than the first and second gate regions, and
wherein the first convexity and the second convexity are disposed on the buffer layer.

16. A manufacturing method of a semiconductor device having a depletion mode JFET and an enhancement mode JFET comprising:
selectively etching a channel-region-to-be-formed region of a depletion mode JFET region on a first surface of a substrate made of semiconductor material so that a concavity is formed on the channel-region-to-be-formed region;

selectively etching a region around a channel-region-to-be-formed region of an enhancement mode JFET region on the first surface of the substrate so that a convexity is formed on the channel-region-to-be-formed region;

epitaxially growing a channel layer having the first conductive type on the substrate, in the concavity and on the convexity, wherein a thickness of the channel layer on the convexity is smaller than a thickness of the channel layer in the concavity;

epitaxially growing a gate region having a second conductive type on the channel layer in both of the depletion mode JFET region and the enhancement mode JFET region;

forming a source region and a drain region on respective sides of the gate region in the channel layer of both of the depletion mode JFET region and the enhancement mode JFET region, wherein each of the source region and the drain region has the first conductive type and an impurity concentration higher than the channel layer;

forming a gate electrode electrically coupled with the gate region;

forming a source electrode electrically coupled with the source region; and forming a drain electrode electrically coupled with the drain region.

17. The manufacturing method according to claim 16,
wherein a width of a bottom of the concavity along with a direction from the source region to the drain region of the depletion mode JFET region is in a range between 0.1 and 1.0 micrometers, and
wherein a width of a top of the convexity along with a direction from the source region to the drain region of the enhancement mode JFET region is in a range between 0.5 and 2.0 micrometers.

18. The manufacturing method according to claim 16, further comprising:
epitaxially growing a buffer layer on the first surface of the substrate,
wherein the buffer layer has the second conductive type and an impurity concentration lower than the gate region,
wherein the selectively etching of the channel-region-to-be-formed region of the depletion mode JFET region is performed on the buffer layer so that the concavity is formed on the buffer layer,
wherein the selectively etching of the region around the channel-region-to-be-formed region of the enhancement mode JFET region is performed on the buffer layer so that the convexity is formed on the buffer layer, and
wherein the epitaxially growing of the channel layer is performed after the epitaxially growing of the buffer layer so that the channel layer is formed on the buffer layer.

19. The manufacturing method according to claim 16,
wherein the semiconductor material is wide gap semiconductor material.

20. The manufacturing method according to claim 16,
wherein the wide gap semiconductor material is SiC, and
wherein the substrate is a SiC substrate.

21. A manufacturing method of a semiconductor device having a depletion mode JFET and an enhancement mode JFET comprising:
selectively etching a channel-region-to-be-formed region of a depletion mode JFET region on a first surface of a substrate made of semiconductor material so that a first concavity is formed on the channel-region-to-be-formed region;

selectively etching a channel-region-to-be-formed region of an enhancement mode JFET region on the first surface of the substrate so that a second concavity is formed on the channel-region-to-be-formed region, epitaxially growing a channel layer having the first conductive type on the substrate, in the first concavity and in the second concavity, wherein a thickness of the channel layer in the second concavity is smaller than a thickness of the channel layer in the first concavity;

epitaxially growing a gate region having a second conductive type on the channel layer in both of the depletion mode JFET region and the enhancement mode JFET region;

forming a source region and a drain region on respective sides of the gate region in the channel layer of both of the depletion mode JFET region and the enhancement mode JFET region, wherein each of the source region and the drain region has the first conductive type and an impurity concentration higher than the channel layer;

forming a gate electrode electrically coupled with the gate region;

forming a source electrode electrically coupled with the source region; and forming a drain electrode electrically coupled with the drain region, wherein a bottom of the first concavity has a first width along with a direction from the source region to the drain region of the depletion mode JFET, wherein a bottom of the second concavity has a second width along with a direction from the source region to the drain region of the enhancement mode JFET, and wherein the second width is larger than the first width.

22. The manufacturing method according to claim 21,
wherein the first width is in a range between 0.1 and 1.0 micrometers, and
wherein the second width is in a range between 0.5 and 2.0 micrometers.

23. The manufacturing method according to claim 21, further comprising:
forming a first conductive type layer on the first surface of the substrate before the epitaxially growing of the channel layer,
wherein the first conductive type layer has an impurity concentration higher than the channel layer,
wherein the selectively etching of the channel-region-to-be-formed region of the depletion mode JFET region is performed on the first conductive type layer so that the first concavity is formed on the first conductive type layer,
wherein the first concavity penetrates the first conductive type layer and reaches the substrate so that the first conductive type layer is divided by the first concavity into two parts, one part providing the source region, and the other part providing the drain region,
wherein the selectively etching of the channel-region-to-be-formed region of the enhancement mode JFET region is performed on the first conductive type layer so that the second concavity is formed on the first conductive type layer,
wherein the second concavity penetrates the first conductive type layer and reaches the substrate so that the first conductive type layer is divided by the second concavity into two parts, one part providing the source region, and the other part providing the drain region, and
wherein the selectively etching of the channel-region-to-be-formed region of the depletion mode JFET region and the selectively etching of the channel-region-to-beformed region of the enhancement mode JFET region are performed simultaneously so that the forming of the source region and the drain region in both of the depletion mode JFET region and the enhancement mode JFET region are executed.

24. The manufacturing method according to claim 21, further comprising:
  epitaxially growing a buffer layer on the first surface of the substrate,
  wherein the buffer layer has the second conductive type and an impurity concentration lower than the gate region,
  wherein the selectively etching of the channel-region-to-be-formed region of the depletion mode JFET region is performed on the buffer layer so that the first concavity is formed on the buffer layer,
  wherein the selectively etching of the channel-region-to-be-formed region of the enhancement mode JFET region is performed on the buffer layer is that the second concavity is formed on the buffer layer, and
  wherein the epitaxially growing of the channel layer is performed after the epitaxially growing of the buffer layer so that the channel layer is formed on the buffer layer.

25. A manufacturing method of a semiconductor device having a depletion mode JFET and an enhancement mode JFET comprising:
  selectively etching a region around a channel-region-to-be-formed region of a depletion mode JFET region on a first surface of a substrate made of semiconductor material so that a first convexity is formed on the channel-region-to-be-formed region;
  selectively etching a region around a channel-region-to-be-formed region of an enhancement mode JFET region on a first surface of the substrate so that a second convexity is formed on the channel-region-to-be-formed region;
  epitaxially growing a channel layer having the first conductive type on the substrate, on the first convexity and on the second convexity, wherein a thickness of the channel layer on the second convexity is smaller than a thickness of the channel layer on the first convexity;
  epitaxially growing a gate region having a second conductive type on the channel layer in both of the depletion mode JFET region and the enhancement mode JFET region;
  forming a source region and a drain region on respective sides of the gate region in the channel layer of both of the depletion mode JFET region and the enhancement mode JFET region, wherein each of the source region and the drain region has the first conductive type and an impurity concentration higher than the channel layer;
  forming a gate electrode electrically coupled with the gate region;
  forming a source electrode electrically coupled with the source region; and
  forming a drain electrode electrically coupled with the drain region,
  wherein a top of the first convexity has a first width along with a direction from the source region to the drain region of the depletion mode JFET,
  wherein a top of the second convexity has a second width along with a direction from the source region to the drain region of the enhancement mode JFET, and
  wherein the second width is smaller than the first width.

26. The manufacturing method according to claim 25,
  wherein the first width is in a range between 0.5 and 2.0 micrometer, and
  wherein the second width is in a range between 0.1 and 1.0 micrometers.

27. The manufacturing method according to claim 25, further comprising:
  epitaxially growing a buffer layer on the first surface of the substrate,
  wherein the buffer layer has the second conductive type and an impurity concentration lower than the gate region,
  wherein the selectively etching of the region around the channel-region-to-be-formed region of the depletion mode JFET region is performed on the buffer layer so that the first convexity is formed on the buffer layer,
  wherein the selectively etching of the region around the channel-region-to-be-formed region of the enhancement mode JFET region is performed on the buffer layer is that the second convexity is formed on the buffer layer, and
  wherein the epitaxially growing of the channel layer is performed after the epitaxially growing of the buffer layer so that the channel layer is formed on the buffer layer.

* * * * *